United States Patent
Park et al.

(10) Patent No.: US 10,756,307 B2
(45) Date of Patent: Aug. 25, 2020

(54) PANEL BOTTOM SHEET AND DISPLAY DEVICE INCLUDING THE SAME

(71) Applicant: SAMSUNG DISPLAY CO., LTD., Yongin-si, Gyeonggi-do (KR)

(72) Inventors: Nam Hee Park, Cheonan-si (KR); Eun Gil Choi, Cheonan-si (KR); Dae Kyun Oh, Hwaseong-si (KR); Young Joo Lee, Busan (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/858,086

(22) Filed: Dec. 29, 2017

(65) Prior Publication Data
US 2018/0366685 A1    Dec. 20, 2018

(30) Foreign Application Priority Data
Jun. 19, 2017    (KR) .................. 10-2017-0077355

(51) Int. Cl.
| | |
|---|---|
| *H01L 51/52* | (2006.01) |
| *G06F 1/16* | (2006.01) |
| *H01L 51/00* | (2006.01) |
| *B29D 11/00* | (2006.01) |
| *G06F 3/044* | (2006.01) |

(Continued)

(52) U.S. Cl.
CPC ...... *H01L 51/5284* (2013.01); *B29D 11/0073* (2013.01); *G02F 1/13338* (2013.01); *G06F 1/1603* (2013.01); *G06F 1/1626* (2013.01); *G06F 1/1637* (2013.01); *G06F 1/1643* (2013.01); *G06F 3/041* (2013.01); *G06F 3/044* (2013.01); *G06F 3/0412* (2013.01); *H01L 51/0096* (2013.01); *H01L 51/524* (2013.01); *H01L 51/529* (2013.01); *H01L 51/5253* (2013.01); *H01L 51/5281* (2013.01); *H04M 1/0266* (2013.01)

(58) Field of Classification Search
CPC ...... G06F 1/1643; G06F 3/041; G06F 3/0412; G06F 3/044; H01L 51/5284; B29D 11/0073; G02F 1/13338
See application file for complete search history.

(56) References Cited

U.S. PATENT DOCUMENTS
| | | |
|---|---|---|
| 9,656,821 B2 | 5/2017 | Kato et al. |
| 2015/0102296 A1 | 4/2015 | Kim et al. |

(Continued)

FOREIGN PATENT DOCUMENTS
| | | |
|---|---|---|
| EP | 2806475 A2 | 11/2014 |
| EP | 2886331 A1 | 6/2015 |

(Continued)

OTHER PUBLICATIONS

Extended European Search Report dated Jul. 2, 2018, 13 Pages.

*Primary Examiner* — Nidhi Thaker
(74) *Attorney, Agent, or Firm* — Innovation Counsel LLP

(57) ABSTRACT

A panel bottom sheet and a display device including the same are provided. The panel bottom sheet includes a first base, a first light-absorbing layer disposed on a top surface or a bottom surface of the first base, a top bonding layer disposed above the first base and the first light-absorbing layer, an interlayer bonding layer disposed below the first base and the first light-absorbing layer, and a wiring pattern portion disposed below the interlayer bonding layer and including a plurality of wiring patterns.

24 Claims, 16 Drawing Sheets

(51) Int. Cl.
*G06F 3/041* (2006.01)
*H04M 1/02* (2006.01)
*G02F 1/1333* (2006.01)

(56) References Cited

U.S. PATENT DOCUMENTS

| | | | |
|---|---|---|---|
| 2015/0199062 A1 | 7/2015 | Lang | |
| 2016/0062516 A1* | 3/2016 | Jeong | G06F 1/1637 |
| | | | 345/174 |
| 2016/0066412 A1* | 3/2016 | Choi | G06F 1/1626 |
| | | | 361/704 |
| 2016/0077629 A1* | 3/2016 | Ono | G06F 3/044 |
| 2016/0307968 A1* | 10/2016 | Yoon | G06F 3/044 |
| 2017/0115758 A1* | 4/2017 | Lee | G06F 3/044 |

FOREIGN PATENT DOCUMENTS

| | | | | |
|---|---|---|---|---|
| EP | 2993564 A1 | 3/2016 | | |
| WO | 2005/019367 A1 | 3/2005 | | |
| WO | WO-2005019367 A1 * | 3/2005 | | C09J 7/29 |
| WO | 2017/073469 A1 | 5/2017 | | |

\* cited by examiner

PANEL BOTTOM SHEET AND DISPLAY DEVICE INCLUDING THE SAME

This application claims priority to Korean Patent Application No. 10-2017-0077355, filed on Jun. 19, 2017, and all the benefits accruing therefrom under 35 U.S.C. § 119, the disclosure of which is incorporated herein by reference in its entirety.

BACKGROUND

1. Field

The present disclosure relates to a panel bottom sheet and a display device including the same.

2. Description of the Related Art

Organic light-emitting display devices have many advantages such as their excellent luminance, driving voltage, response speed characteristics and capability of realizing multiple colors, and thus have been applied to various products, including smart phones. A typical organic light-emitting display includes a display panel including organic light-emitting elements. In each of the organic light-emitting elements, a cathode electrode and an anode electrode are arranged to face each other with an organic light-emitting layer interposed therebetween. In response to a voltage applied to the cathode and anode electrodes, visible light is generated in the organic light emitting layer to which the cathode and anode electrodes are both connected.

A panel bottom sheet is attached to the bottom of a display panel of a display device. The panel bottom sheet may include various functional sheets for protecting the display panel against heat or an external shock. Also, the panel bottom sheet may further include an auxiliary input device (such as a digitizer) or a driving device that is difficult to place on the top of the display panel.

The auxiliary device such as a digitizer may include wiring patterns. The wiring patterns are generally formed of a metal. When the display device is used in an outdoor environment, the wiring patterns may become visible on the display screen of the display device because of reflected light by the wiring patterns which cause a serious deterioration of the display quality of the display device.

SUMMARY

Exemplary embodiments of the present disclosure provide a panel bottom sheet capable of reducing the visibility of wiring patterns.

Exemplary embodiments of the present disclosure also provide a display device capable of reducing the visibility of wiring patterns of a panel bottom sheet.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a panel bottom sheet. The panel bottom sheet comprises a first base, a first light-absorbing layer disposed on a top surface or a bottom surface of the first base, a top bonding layer disposed above the first base and the first light-absorbing layer, an interlayer bonding layer disposed below the first base and the first light-absorbing layer, and a wiring pattern portion disposed below the interlayer bonding layer and including a plurality of wiring patterns.

According to an exemplary embodiment of the present disclosure, there is provided a display device. The display device comprises a display panel, and a panel bottom sheet disposed below the display panel, wherein the panel bottom sheet includes a first base, a first light-absorbing layer disposed on a top surface or a bottom surface of the first base, a top bonding layer disposed above the first base and the first light-absorbing layer, an interlayer bonding layer disposed below the first base and the first light-absorbing layer, and a wiring pattern portion disposed below the interlayer bonding layer and including a plurality of wiring patterns.

According to the aforementioned and other exemplary embodiments of the present disclosure, the visibility of wiring patterns can be reduced by reducing light reflected by wiring patterns or height differences formed by the wiring patterns.

Other features and exemplary embodiments may be apparent from the following detailed to description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
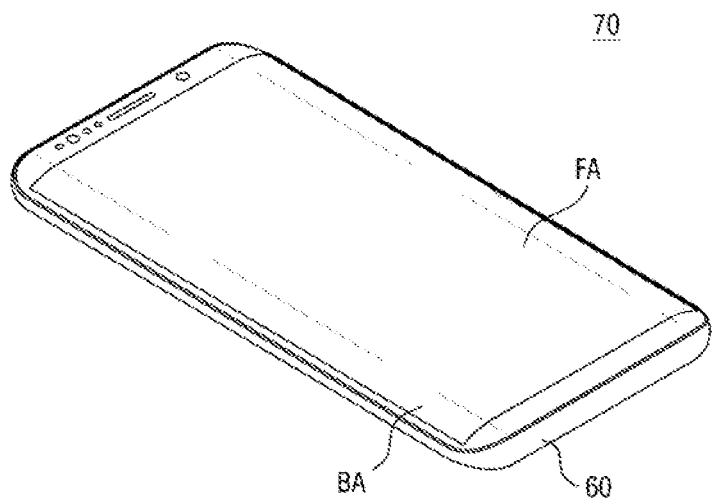
FIG. 1 is a perspective view of a display device according to an exemplary embodiment of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure will only be defined within the scope of the appended claims.

Cases where elements or layers are referred to as being located "on" other elements or layers include all the cases where other layers or other elements are interposed directly on or between other elements. Meanwhile, cases where the elements are "directly on" indicate that no other element or layer is interposed therebetween. Same reference numerals refer to the same constituent elements throughout the specification. Term 'and/or" includes each and every combination of one or more of the referenced items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present invention.

Exemplary embodiments of the present disclosure will hereinafter be described with reference to the accompanying drawings.

Figure 2:
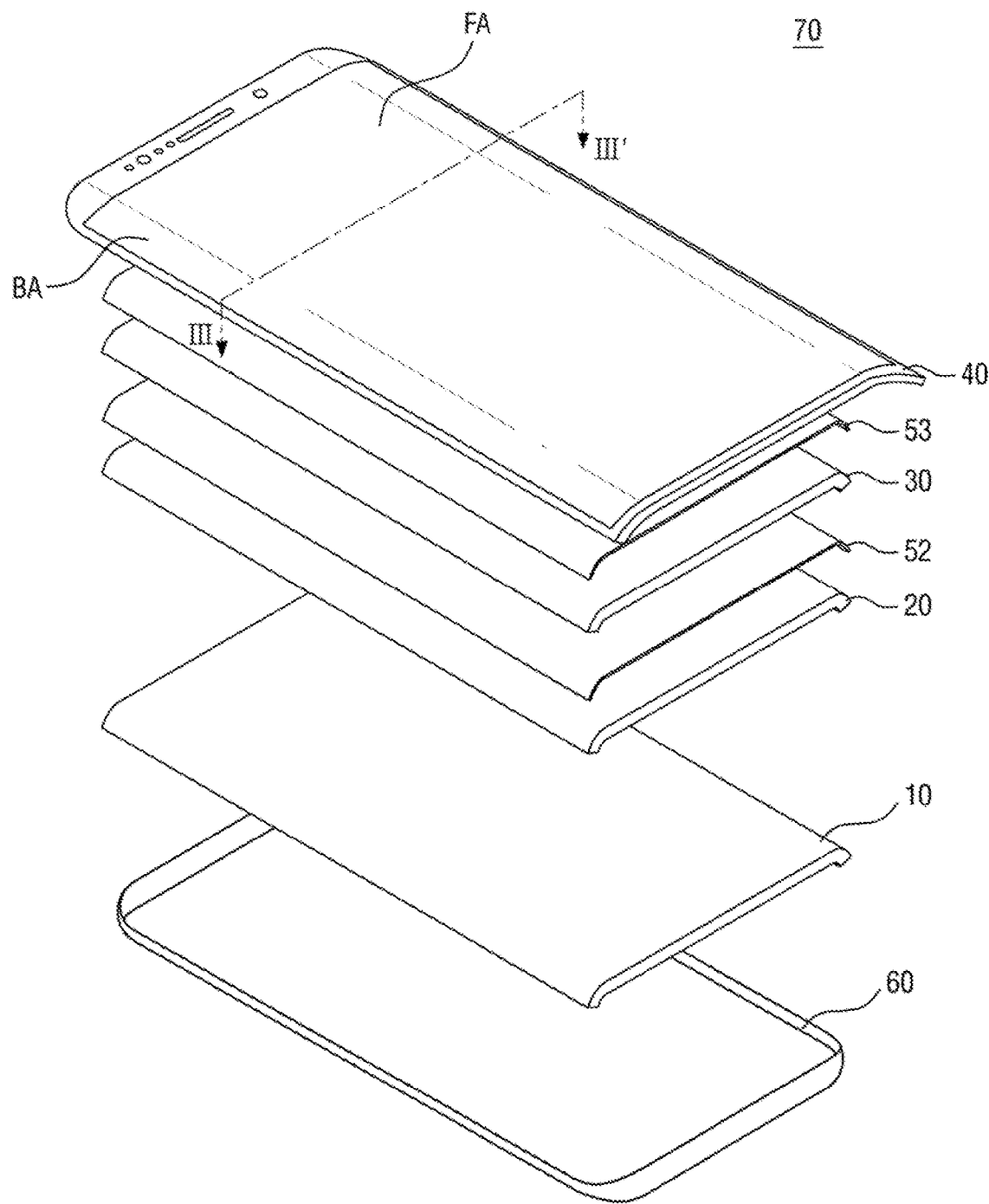
FIG. 2 is an exploded perspective view of the display device according to the exemplary embodiment of FIG. 1.
Figure 3:
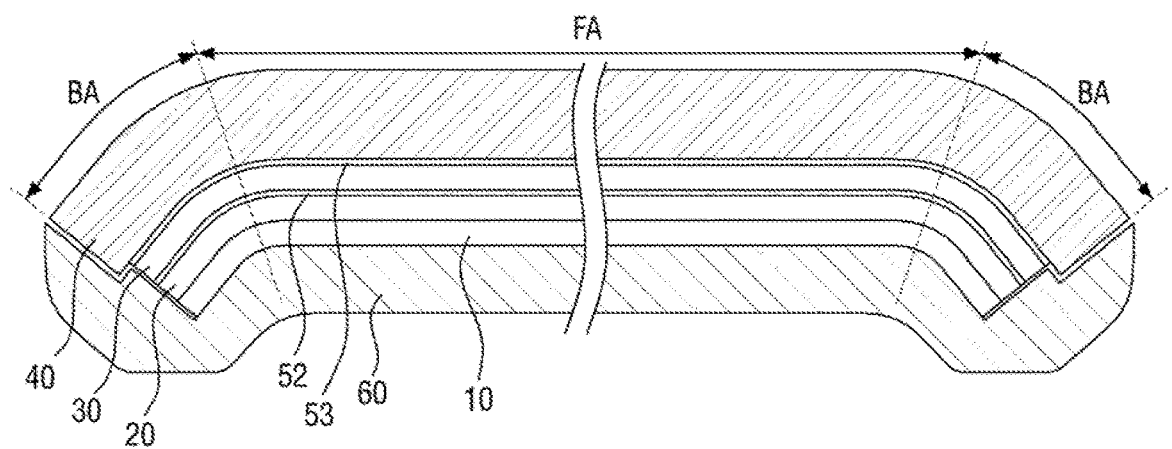
FIG. 3 is a cross-sectional view taken along line III-III' of FIG. 2.

FIG. 1 is a perspective view of a display device according to an exemplary embodiment of the present disclosure. FIG. 2 is an exploded perspective view of the display device according to the exemplary embodiment of FIG. 1. FIG. 3 is a cross-sectional view taken along line III-III' of FIG. 2.

Referring to FIGS. 1 through 3, a display device 70 includes a display panel 20 and a panel bottom sheet 10 disposed below the display panel 20. The display device 70 may further include a window 40 disposed above the display panel 20. The display device 70 may further include a bracket 60 disposed below the panel bottom sheet 10.

Unless specified otherwise, the terms "upper", "top" or "top surface", and "above," as used herein, refer to a display surface side of the display panel 20, and the terms "lower", "bottom" or "bottom surface", or "below," as used herein, refer to an opposite side to the display surface side of the display panel 20.

The display device 70 may be rectangular in a plan view. The display device 70 may have two long sides and two short sides. The long sides and the short sides of the display device 70 meet at a right angle. Alternatively, as illustrated in FIG. 1, the long sides and the short sides of the display device 70 meet to form curved surfaces, as illustrated in FIG. 1. The planar shape of the display device 70 is not particularly limited, and the display device 70 may be in a shape other than a rectangular shape such as, for example, a circular shape, in a plan view.

The display panel 20 is a panel for displaying an image and may be, for example, an organic light-emitting display panel. The display panel 20 will hereinafter be described as being an organic light-emitting display panel, but various types of display panels other than an organic light-emitting display panel, such as, for example, a liquid crystal display (LCD) panel, an electrophoretic display panel, or the like may be used as the display panel 20.

The display panel 20 includes a plurality of organic light-emitting elements disposed on a substrate. The substrate may be a rigid substrate formed of, for example, glass, or may be a flexible substrate formed of, for example, polyimide (PI). In a case where a PI substrate is used as the substrate, the display panel 20 may be a flexible panel such as a bendable panel, a foldable panel and a rollable panel.

The window 40 is disposed above the display panel 20. The window 40 protects the display panel 20 from an external shock from the display surface side and allows the transmission of light emitted from the display panel 20. The window 40 may be formed of, for example, glass.

The window 40 may be disposed to overlap with the display panel 20 and to cover the entire surface of the display panel 20. The window 40 may be larger in size than the display panel 20. For example, the window 40 may protrude beyond the display panel 20 on both short sides of the display device 70. The window 40 may also protrude beyond the display panel 20 on both long sides of the display device 70, but the distance by which the window 40 may protrude beyond the display panel 20 on both short sides of the display device 70 may be greater than the distance by which the window 40 may protrude beyond the display panel 20 on both long sides of the display device 70.

In one exemplary embodiment, a touch member 30 may be disposed between the display panel 20 and the window 40. The touch member 30 may be a rigid panel type, a flexible panel type, or a film type. The touch member 30 may have substantially the same size as the display panel 20 and may be disposed to overlap with the display panel 20 so that the sides thereof can be aligned with the sides of the display panel 20, but the present disclosure is not limited thereto. The display panel 20 and the touch member 30 may be bonded together by a transparent bonding layer 52 such as an optically clear adhesive (OCA) or an optically clear resin (OCR), and the touch member 30 and the window 40 may be bonded together by a transparent bonding layer 53 such as an OCA or an OCR. The touch member 30 may be omitted, in which case, the display panel 20 and the window 40 may be bonded together by an OCA or an OCR. In one exemplary embodiment, the display panel 20 may include a touch member 30.

The panel bottom sheet 10 is disposed below the display panel 20. The panel bottom sheet 10 includes a top bonding layer (130 of FIG. 4) at an uppermost portion thereof and may be attached to the bottom surface of the display panel 20 via the top bonding layer 130.

The panel bottom sheet 10 may have substantially the same size as the display panel 20 and may be disposed to overlap with the display panel 20 so that the sides thereof can be aligned with the sides of the display panel 20, but the present disclosure is not limited thereto. The panel bottom sheet 10 may perform a heat dissipation function, an electromagnetic shielding function, a pattern visibility prevention function, a grounding function, a buffer function, a reinforcement function, and/or a digitizing function, and may include at least one functional layer having at least one of these functions of the panel bottom sheet 10. The functional layer may be provided in various forms such as a layer, a film, a sheet, a plate, or a panel.

The panel bottom sheet 10 may include one or more functional layers. In a case where the panel bottom sheet 10 includes a plurality of functional layers, the functional layers may be stacked to overlap with one another. The functional layers may be stacked directly on one another or may be stacked indirectly via bonding layers.

Various example of the panel bottom sheet 10 will be described later.

The bracket 60 is disposed below the panel bottom sheet 10. The bracket 60 receives the window 40, the touch member 30, the display panel 20, and the panel bottom sheet 10 therein. The bracket 60 may have a bottom surface and sidewalls. The bottom surface of the bracket 60 is opposite to the bottom surface of the panel bottom sheet 10, and the sidewalls of the bracket 60 faces the sides of each of the window 40, the touch member 30, the display panel 20, and the panel bottom sheet 10. The panel bottom sheet 10 includes a bottom bonding member 450 of FIG. 11 at a lowermost portion thereof and may be attached to the bottom surface of the bracket 60 via the bottom bonding member 450.

Although not specifically illustrated, waterproof tapes may be disposed along the edges of the bottom surface of the bracket 60. The waterproof tapes disposed along the long sides of the bracket 60 may be attached to the bottom surface of the panel bottom sheet 10, and the waterproof tapes disposed along the short sides of the bracket 60 may be attached to the bottom surface of the window 40.

In one exemplary embodiment, the display device 70 may include a flat area FA and bending areas BA connected to the flat area FA and disposed adjacent to the flat area FA. The flat area FA may be disposed substantially on one plane. The bending areas BA are not on the same plane as the flat area FA. For example, the bending areas BA may be bent downwardly from the plane where the flat area FA is disposed.

In one exemplary embodiment, the bending areas BA may have outwardly convex surfaces. In another exemplary embodiment, the bending areas BA may have flat surfaces that are disposed on a plane having a predetermined angle with respect to the plane of the flat area FA.

The bending areas BA may be provided on both long sides of the display device 70, which is rectangular, or on one of the long sides of the display device 70. Although not specifically illustrated, the display device 70 may also be bent on the short sides thereof.

The display panel 20, the touch member 30, the window 40, and the panel bottom sheet 10 may all be positioned in both the flat area FA and the bending areas BA.

In an alternative exemplary embodiment, the display device 70 may be a flat display device only having the flat area FA. Thus, all the aspects of the display device 70 discussed herein, except for those specifically related to the bending areas BA, may be directly applicable not only to a bendable display device, but also to a flat display device.

The panel bottom sheet 10 will hereinafter be described in further detail.

Figure 4:
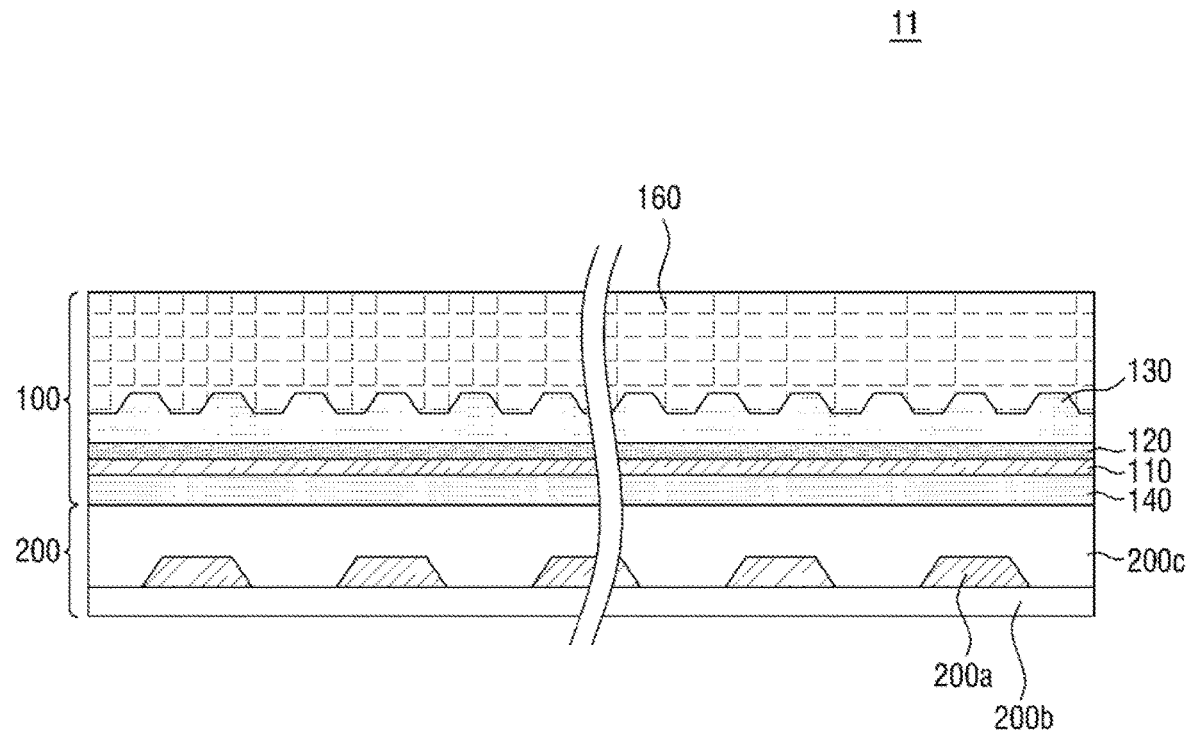
FIG. 4 is a cross-sectional view of a panel bottom sheet according to an exemplary embodiment of the present disclosure.

FIG. 4 is a cross-sectional view of a panel bottom sheet according to an exemplary embodiment of the present disclosure. For convenience, FIG. 4 illustrates a generally flat panel bottom sheet. The flat panel bottom sheet of FIG. 4 maintains its shape when attached to a flat display panel. However, when attached to a curved display panel, the flat panel bottom sheet may be bent along the curved display panel and may have a flat area and bending areas. This directly applies not only to the panel bottom sheet of FIG. 4, but also to panel bottom sheets of FIGS. 5 through 11 and 13.

Referring to FIG. 4, a panel bottom sheet 11 includes a cover panel portion 100 and a wiring pattern portion 200 disposed below the cover panel portion 100.

The cover panel portion 100 includes a cover base 110, a first light-absorbing layer 120, a top bonding layer 130 disposed on the top surface of the first light-absorbing layer 120, a first release film 160 disposed on the top surface of the top bonding layer 130, and a first interlayer bonding layer 140 disposed on the bottom surface of the cover base 110.

The cover base 110 may be formed of polyethylene terephthalate (PET), PI, polycarbonate (PC), polyethylene (PE), polypropylene (PP), polysulfone (PSF), polymethyl methacrylate (PMMA), triacetyl cellulose (TAC), or a cyclo-olefin polymer (COP).

The first light-absorbing layer 120 is disposed on the top surface of the cover base 110. The first light-absorbing layer 120 is disposed directly on the top surface of the cover base 110. The first light-absorbing layer 120 may be disposed to completely cover wiring patterns 200a. The first light-absorbing layer 120 may be disposed on the entire top surface of the cover base 110.

The first light-absorbing layer 120 blocks transmission of light therethrough and thus prevents the wiring pattern 200a of a wiring pattern portion 200 from being visible from thereabove. The first light-absorbing layer 120 may comprise a light-absorbing material such as, for example, a black dye or pigment. The first light-absorbing layer 120 may comprise a black ink. The first light-absorbing layer 120 may be formed on the top surface of the cover base 110 by a coating or printing method. The first light-absorbing layer 120 will be described later in detail.

The top bonding layer 130 is disposed on the top surface of the first light-absorbing layer 120. The top bonding layer 130 attaches the panel bottom sheet 11 to the bottom surface of the display panel 20. The top bonding layer 130 may include an adhesive layer or a resin layer. For example, the top bonding layer 130 may comprise a polymer material such as a silicone polymer, a urethane polymer, a silicone-urethane (SU) hybrid polymer, an acrylic polymer, an isocyanate polymer, a polyvinyl alcohol polymer, a gelatin polymer, a vinyl polymer, a latex polymer, a polyester polymer, or a water-based polyester polymer.

The first release film 160 is disposed on the top surface of the top bonding layer 130. The first release film 160 covers and protects the top surface of the top bonding layer 130 when the panel bottom sheet 11 is yet to be attached to the display panel 20. Then, when the panel bottom sheet 11 is attached to the display panel 20, the first release film 160 is peeled off and thus exposes the top surface of the top bonding layer 130, which becomes a bonding surface.

The first release film 160 may be placed in contact with the top bonding member 130, but may not be completely attached on the top bonding member 130 so as to be able to be peeled off later. The first release film 160 may comprise PET, PC, PI, or paper. In order to improve the release force of the first release film 160, the top surface of the first release film 160 may be treated with a silicon solution or coated with a release coating layer, but the present disclosure is not limited to this.

Figure 5:
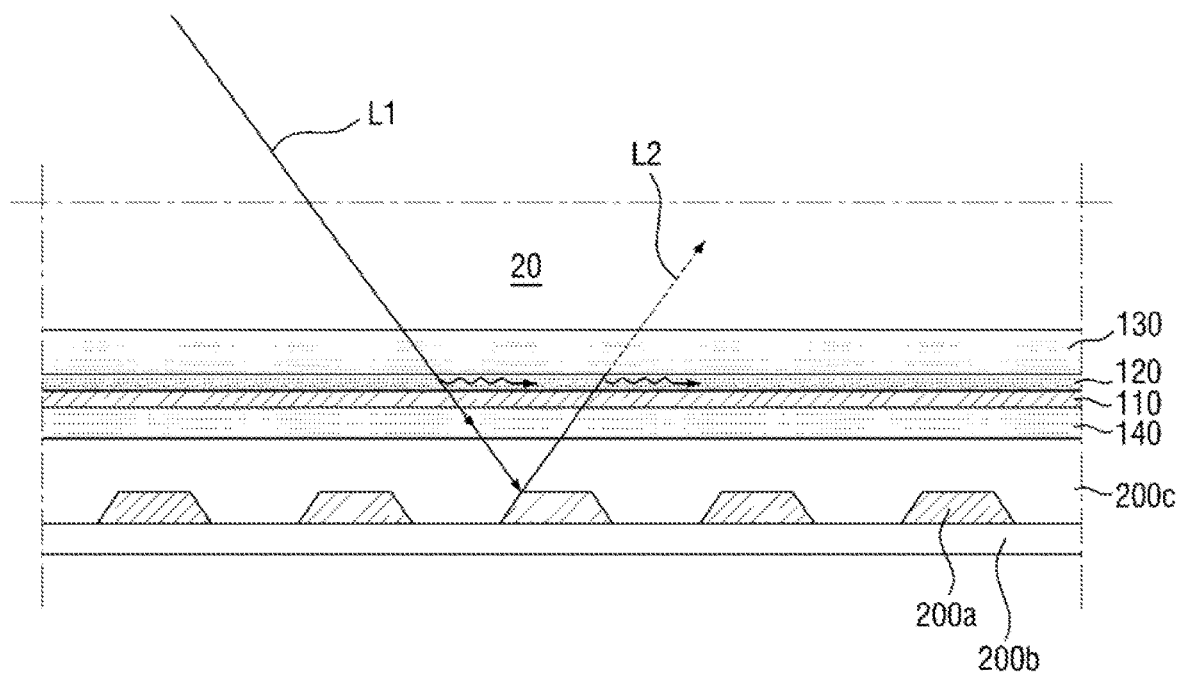
FIG. 5 is a cross-sectional view illustrating the path of light in a panel bottom sheet in which a first light-absorbing layer is disposed on the top surface of a cover base.

In some exemplary embodiments, the bottom surface of the first release film 160 may have an embossed shape. The embossed shape of the bottom surface of the first release film 16 may be transferred to the top surface of the top bonding layer 130, which is attached to the first release film 16, and as a result, the top surface of the top bonding layer 130 may have an embossed shape that is complementary to the embossed shape of the bottom surface of the first release film 160. In a case where the top surface of the top bonding layer 130 has an embossed shape, the embossed shape of the top surface of the top bonding layer 130 serves as an air passage during the attachment of the panel bottom sheet 11 to the bottom surface of the display panel 20, and may thus reduce air bubbles between the display panel 20 and the panel bottom sheet 11. Once the top bonding layer 130 is completely attached to the bottom of the display panel 20, the embossed shape of the top surface of the top bonding layer 130 may collapse and may be planarized, as illustrated in FIG. 5.

The first interlayer bonding layer 140 is disposed on the bottom surface of the cover base 110. The first interlayer bonding layer 140 may bond the cover base 110 and the wiring to pattern portion 200 together. That is, the first interlayer bonding layer 140 may bond the cover panel portion 100 to the wiring pattern portion 200, which is disposed below the cover panel portion 100. In the exemplary embodiment of FIG. 4, the first interlayer bonding layer 140 may be included in the cover panel portion 100, but alternatively, the first interlayer bonding layer 140 may be included in the wiring pattern portion 200 or may be provided as a separate member.

The first interlayer bonding layer 140 may be formed of one of the aforementioned examples of the material of the top bonding layer 130.

The wiring pattern portion 200 may include the wiring patterns 200a and a plurality of insulating layers (200b and 200c) covering the wiring patterns 200a from above and below, respectively. Specifically, the wiring pattern portion 200 may include a first insulating layer 200b, the wiring patterns 200a disposed on the top surface of the first insulating layer 200b, and a second insulating layer 200c covering the top surfaces of the wiring patterns 200a. The wiring patterns 200a cover some parts of the top surface of the first insulating layer 200b and expose other parts of the top surface of the first insulating layer 200b. The second insulating layer 200c may be disposed not only on the top surface and the sides of each of the wiring patterns 200a, but also on the exposed parts of the top surfaces of the first insulating layer 200b.

The wiring patterns 200a may comprise a metal material such as, for example, copper (Cu), silver (Ag), nickel (Ni), or tungsten (W). The wiring patterns 200a may be formed as single films or stacks of a plurality of films. In one exemplary embodiment, each of the wiring patterns 200a may be a double layered film including a lower Cu film and an upper Cu film. The wiring patterns 200a may be wirings or electrodes transmitting signals. Also, the wiring patterns 200a may be floating wirings or electrodes.

The first and second insulating layers 200b and 200c may comprise an organic insulating to material, an inorganic insulating material, or an organic-inorganic hybrid insulating material or may comprise a bonding material such as an adhesive material.

In one exemplary embodiment, the wiring pattern portion 200 may be a digitizer. The digitizer, unlike an input device such as a keyboard or a mouse, receives information regarding a position on a screen, designated by a user. The digitizer recognizes the movement of, for example, a stylus pen, and converts the recognized movement into a digital signal. The digitizer may be provided in the form of a thin film or a panel. In a case where the wiring pattern portion 200 is a digitizer, the structure of the digitizer will be described later with reference to FIGS. 12 through 15. However, the present disclosure is not limited to this. That is, alternatively, other various members with wiring patterns, such as a printed circuit board (PCB) or a flexible PCB (FPCB), may be used as the wiring pattern portion 200.

The cover base 110, the first light-absorbing layer 120, the top bonding layer 130, the first release film 160, and the first interlayer bonding layer 140 of the cover panel portion 100 and the first and second insulating layers 200b and 200c of the wiring pattern portion 200 may all overlap with one another, and the sides of each of the cover base 110, the first light-absorbing layer 120, the top bonding layer 130, the first release film 160, and the first interlayer bonding layer 140 of the cover panel portion 100 and the sides of each of the first and second insulating layers 200b and 200c of the wiring pattern portion 200 may all be aligned. The sides of each of the cover base 110, the first light-absorbing layer 120, the top bonding layer 130, the first release film 160, and the first interlayer bonding layer 140 of the cover panel portion 100 and the sides of each of the first and second insulating layers 200b and 200c of the wiring pattern portion 200 may be cutting planes. For example, in a case where the panel bottom sheet 11 is obtained by fabricating and cutting a mother panel bottom sheet, the sides of each of the first light-absorbing layer 120, the top bonding layer 130, the first release film 160, and the first interlayer bonding to layer 140 of the cover panel portion 100 and the sides of each of the first and second insulating layers 200b and 200c of the wiring pattern portion 200 may all be cutting planes and may all be aligned.

In a case where the wiring patterns 200a are formed of a material such as a metal, the wiring patterns 200a may have a high reflectivity and may thus be able to well reflect light incident from thereabove. However, if the light reflected by the wiring patterns 200a is emitted toward a display screen, the wiring patterns 200a may be recognized by a user, thereby adversely affecting the display quality of the display device 70.

Since the wiring patterns 200a are formed only on parts of the top surface of the first insulating layer 200b, height differences may be formed between areas where the wiring patterns 200a are disposed and areas where the wiring patterns 200a are not disposed. The height differences may be transferred onto the layers formed on the wiring patterns 200a. That is, for convenience, FIG. 4 illustrates an example in which the top surface of the second insulating layer 200c is flat, but the second insulating layer 200c may be conformally formed on the wiring patterns 200a and may thus have an uneven top surface, rather than a flat top surface. The uneven top surface of the second insulating layer 200c may affect the layers formed on the second insulating layer 200c, i.e., the first interlayer bonding layer 140, the cover base 110, and the first light-absorbing layer 120, and as a result, the surfaces of the first interlayer bonding layer 140, the cover base 110, and the first light-absorbing layer 120 may become at least partially uneven. The uneven surfaces of the first interlayer bonding layer 140, the cover base 110, and the first light-absorbing layer 120 may affect the reflectance or the reflection angle of incident light (i.e., the emission direction of reflected light) so that particular patterns may become visible on the display screen.

The first light-absorbing layer 120 prevents reflected light from being emitted toward the display screen. The first light-absorbing layer 120 primarily prevents light from being downwardly transmitted therethrough and also prevents reflected light from being upwardly transmitted therethrough.

In order to prevent the wiring patterns 200a from becoming visible, the first light-absorbing layer 120 may be formed to be sufficiently thick. If the thickness of the first light-absorbing layer 120 is about 2 μm or more, the first light-absorbing layer 120 may have an optical density (OD) of 3.4 or more and may thus be able to sufficiently lower the reflectivity of the wiring patterns 200a with respect to the display screen, and as a result, the wiring patterns 200a may be prevented from becoming visible. If the thickness of the first light-absorbing layer 120 is about 4 μm or more, the first light-absorbing layer 120 may have an OD of 4 or more, and as a result, the wiring patterns 200a may be prevented from becoming visible, even if height differences formed by the wiring patterns 200a make the surfaces of the layers formed on the wiring patterns 200a to have uneven surface.

The thicker the first light-absorbing layer 120, the higher the OD of the first light-absorbing layer 120. However, the thickness of the first light-absorbing layer 120 may preferably be set to be about 10 μm or less in consideration of coating or printing efficiency, durability, and the thickness of the display device 70.

In the exemplary embodiment of FIG. 4, the first light-absorbing layer 120 may be disposed on the top surface of the cover base 110, but alternatively, the first light-absorbing layer 120 may be disposed on the bottom surface of the cover base 110. The light absorption ratio of the first light-absorbing layer 120 may slightly differ depending on whether the first light-absorbing layer 120 is disposed on the top surface or the bottom surface of the cover base 110, and this will hereinafter be described with reference to FIGS. 5 and 6.

Figure 6:
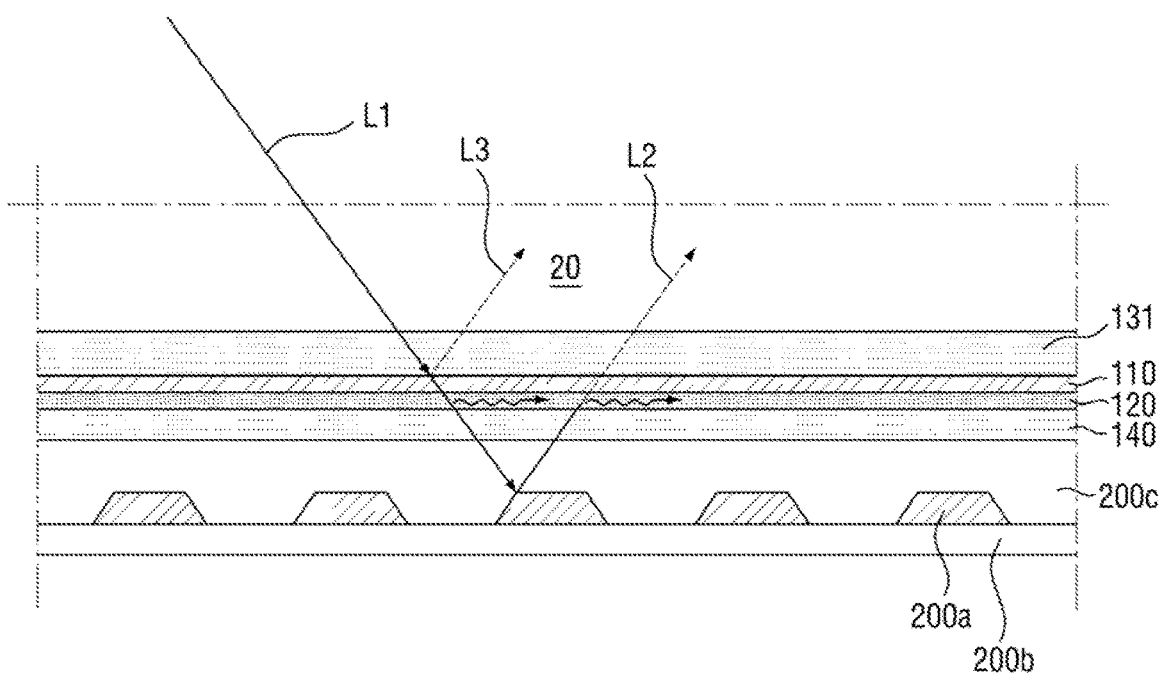
FIG. 6 is a cross-sectional view illustrating the path of light in a panel bottom sheet in which a first light-absorbing layer is disposed on the bottom surface of a cover base.

FIG. 5 is a cross-sectional view illustrating the path of light in a panel bottom sheet in which a first light-absorbing layer is disposed on the top surface of a cover base. FIG. 6 is a cross-sectional view illustrating the path of light in a panel bottom sheet in which a first light-absorbing layer is disposed on the bottom surface of a cover base. FIGS. 5 and 6 illustrate a top bonding layer 131 as being attached on the bottom surface of a display panel 20. In each of the panel bottom sheets of FIGS. 5 and 6, a first release film 160 is already removed and thus no longer exists, and the top surface of the top bonding layer 131 is planarized.

Referring to FIG. 5, light L1 is obliquely incident on a display panel 20 and arrives at a first light-absorbing layer 120 through the top bonding layer 130. The first light-absorbing layer 120 absorbs some of the light L1 and transmits some of the light L1 downwardly therethrough. The light transmitted downwardly through the first light-absorbing layer 120 is reflected by wiring patterns 200a to travel upwardly. The light traveling upwardly arrives at the first light-absorbing layer 120, and the first light-absorbing layer 120 absorbs at least some of the light arriving thereat. Some of the light not absorbed by the first light-absorbing layer 120, i.e., light L2, may be emitted upwardly through the top bonding layer 130. Since a considerable amount of light can be absorbed by the first light-absorbing layer 120, the amount of light (i.e., the light L2) reflected from the wiring patterns 200a and then finally emitted through the first light-absorbing layer 120 is much smaller than the amount of original incident light (i.e., the light L1).

Referring to FIG. 6, light L1 is obliquely incident on a display panel 20 and arrives at a first light-absorbing layer 120 through the top bonding layer 131 and a cover base 110. The light L1 is reflected at the interface between the top bonding layer 131 and the cover base 110. The reflectance and reflection angle of the reflected light, i.e., light L3, may vary depending on the degree of unevenness on the surface of the cover base 110.

Light transmitted through the cover base 110 arrives at the first light-absorbing layer 120, and some of the light arriving at the first light-absorbing layer 120, i.e., light L2, may be absorbed by the first light-absorbing layer 120 and some of the light arriving at the first light-absorbing layer 120 may be transmitted through the first light-absorbing layer 120 and reflected by the wiring patterns 200a upwardly along substantially the same path as the light L2 of FIG. 5.

In response to the light L1 being obliquely incident on the side of the display panel 20, the panel bottom sheet of FIG. 6 emits more light than the panel bottom sheet of FIG. 5 by as much as the light L3. Since light (such as the light L2 and the light L3) emitted from the panel bottom sheet of FIG. 6 adversely affects the visibility of wiring patterns 200a, the panel bottom sheet of FIG. 5, which emits a relatively small amount of light, may be more advantageous than the panel bottom sheet of FIG. 6 in terms of preventing the wiring patterns 200a from becoming visible. The absolute amount of the light L3 reflected at the interface between the top bonding layer 131 and the cover base 110 is not small even when the difference in refractive index between the top bonding layer 131 and the cover base 110 is small, and the visibility of the wiring patterns 200a may be varied by even a slight difference in emitted light. Thus, the difference between the panel bottom sheet of FIG. 5 and the panel bottom sheet of FIG. 6 may produce a significant difference in the visibility of the wiring patterns 200a. Accordingly, in general circumstances, one of the panel bottom sheet of FIG. 5 and the panel bottom sheet of FIG. 6 may be chosen, but in a case where the wiring patterns 200a of the panel bottom sheet of FIG. 6 appear visible, the panel bottom sheet of FIG. 5 may be considered instead of the panel bottom sheet of FIG. 6.

Panel bottom sheets according to other exemplary embodiments of the present disclosure will hereinafter be described. In FIGS. 4 through 11, like reference numerals denote like elements, and thus, descriptions thereof will be omitted or at least simplified.

Figure 7:
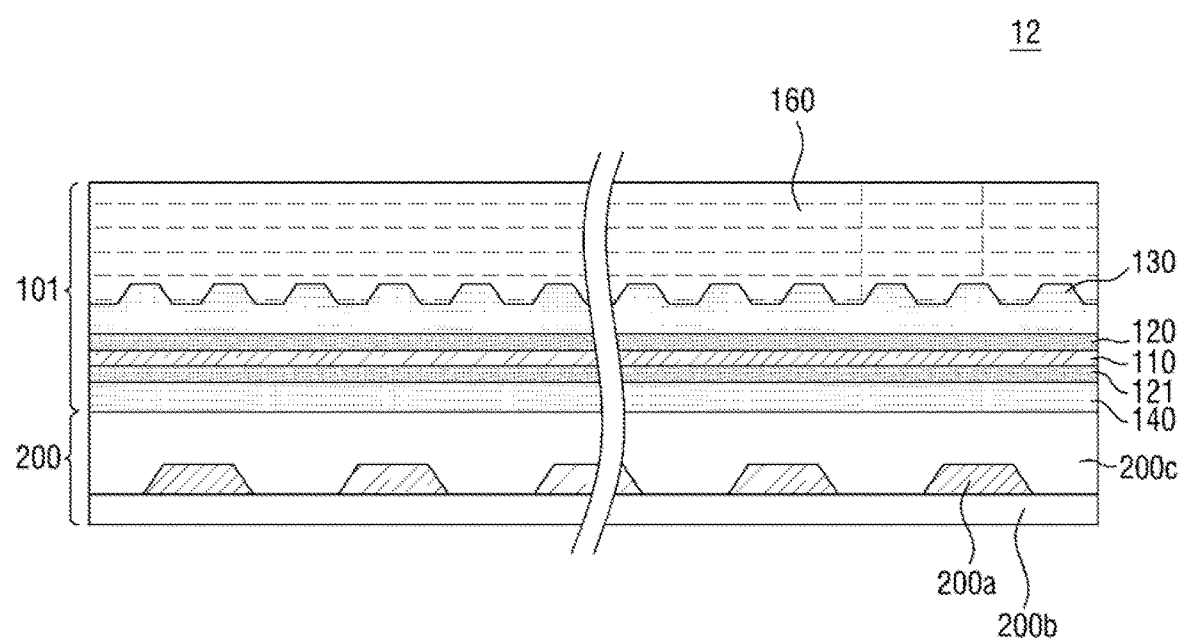
FIG. 7 is a cross-sectional view of a panel bottom sheet according to another exemplary embodiment of the present disclosure.

FIG. 7 is a cross-sectional view of a panel bottom sheet according to another exemplary embodiment of the present disclosure. FIG. 7 shows that a plurality of light-absorbing layers can be provided.

Referring to FIG. 7, a panel bottom sheet 12 differs from the panel bottom sheet 11 of FIG. 4 in that a cover panel portion 101 further includes a second light-absorbing layer 121 disposed on the bottom surface of a cover base 110. That is, a first light-absorbing layer 120 is disposed on the top surface of the cover base 110, and a second light-absorbing layer 121 is disposed on the bottom surface of the cover base 110. A first interlayer bonding layer 140 is disposed on the bottom surface of the second light-absorbing layer 121. The second light-absorbing layer 121 may be formed of the same material as the first light-absorbing layer 120, but the present disclosure is not limited thereto. The second light-absorbing layer 121 may have the same size, and the sides of the second light-absorbing layer 121 may be aligned with the sides of the first light-absorbing layer 120.

In the exemplary embodiment of FIG. 7, the first and second light-absorbing layers 120 and 121 are disposed on the top surface and the bottom surface, respectively, of the cover base 110, and light L1 obliquely incident on a display panel 20 may be absorbed by both the first and second light-absorbing layers 120 and 121. Accordingly, the amount of reflected light finally emitted can be reduced. The light absorption ratio of the panel bottom sheet 12 is generally proportional to the sum of the thicknesses of the first and second light-absorbing layers 120 and 121. Thus, in order for the panel bottom sheet 12 to have substantially the same OD as the panel bottom sheet 11 according to the exemplary embodiment of FIG. 4, the sum of the thicknesses of the first and second light-absorbing layers 120 and 121 may be set to be in the range of about 2 μm to about 10 μm. Alternatively, each of the thicknesses of the first and second light-absorbing layers 120 and 121 may be set to be in the range of about 2 μm to about 10 μm, in which case, the OD of the panel bottom sheet 12 may be further improved if the sum of the thicknesses of the first and second light-absorbing layers 120 and 121 exceeds 10 μm. For example, the first and second light-absorbing layers 120 and 121 may have the same thickness of about 4 μm, but the present disclosure is not limited thereto.

Figure 8:
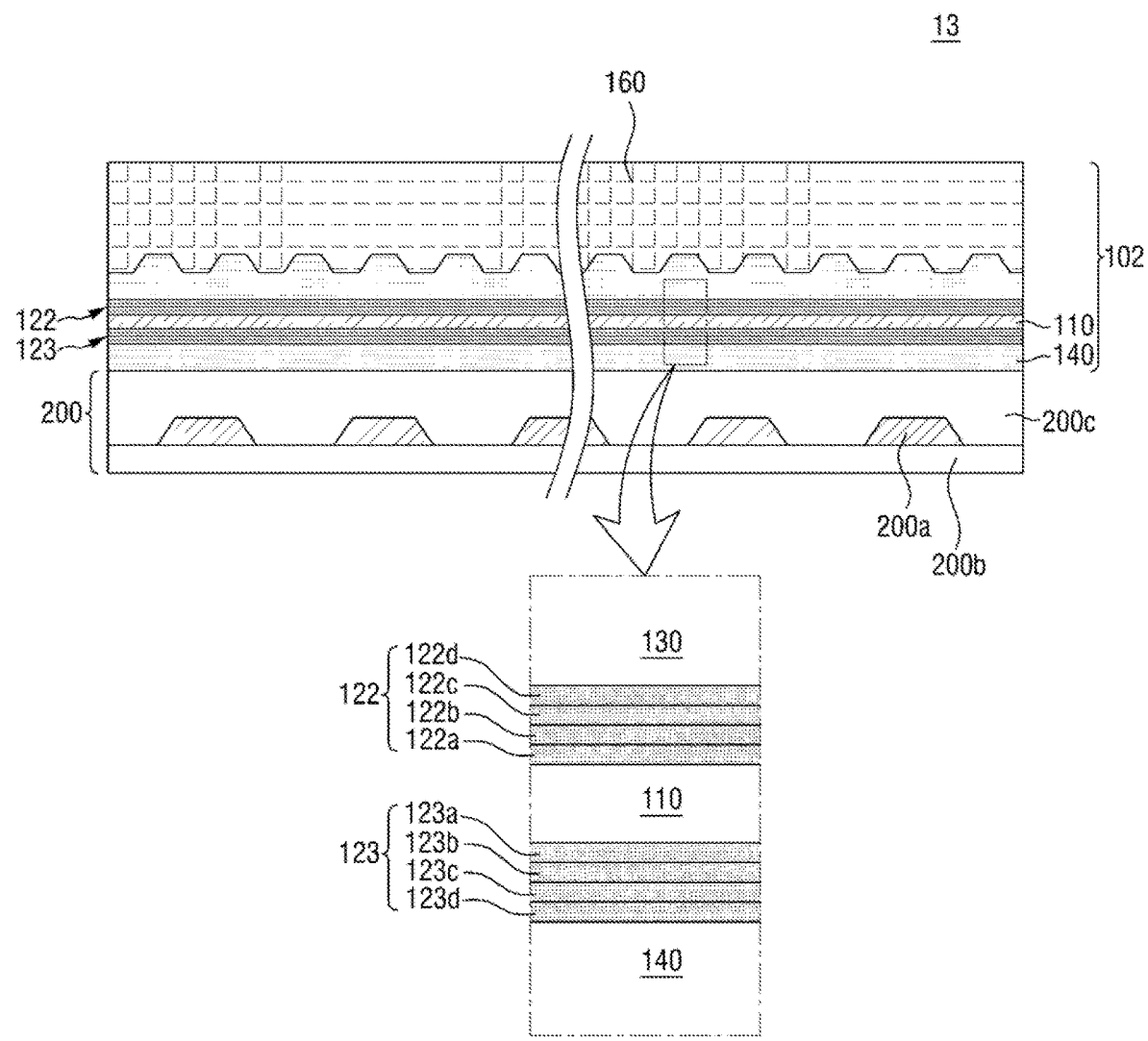
FIG. 8 is a cross-sectional view of a panel bottom sheet according to another exemplary embodiment of the present disclosure.

FIG. 8 is a cross-sectional view of a panel bottom sheet according to another exemplary embodiment of the present disclosure. FIG. 8 shows that a plurality of light-absorbing layers can be provided.

Referring to FIG. 8, a cover panel portion 102 of a panel bottom sheet 13 includes first and second light-absorbing layers 122 and 123.

The first light-absorbing layer 122 includes first through fourth unit layers 122a through 122d, which are sequentially stacked on the top surface of a cover base 110 along an upward direction. A top bonding layer 130 is disposed on the top surface of the fourth unit layer 122d.

The second light-absorbing layer 123 includes first through fourth unit layers 123a through 123d, which are sequentially stacked on the bottom surface of the cover base 110 along a downward direction. A first interlayer bonding layer 140 is disposed on the bottom surface of the fourth unit layer 123d.

The first through fourth unit layers 122a through 122d and the first through fourth unit layers 123a through 123d may be formed of the same material as the first light-absorbing layer 120. The first through fourth unit layers 122a through 122d and the first through fourth unit layers 123a through 123d may comprise the same material, but the present disclosure is not limited thereto.

The first through fourth unit layers 122a through 122d and the first through fourth unit layers 123a through 123d may all have the same thickness. The thickness of the first light-absorbing layer 122 may be determined by the sum of the thicknesses of the first through fourth unit layers 122a through 122d, and the thickness of the second light-absorbing layer 123 may be determined by the sum of the thicknesses of the first through fourth unit layers 123a through 123d. If the first through fourth unit layers 122a through 122d and the first through fourth unit layers 123a through 123d all have the same thickness of, for example, about 1 μm, the thicknesses of the first and second light-absorbing layers 122 and 123 may both be about 4 μm.

The first through fourth unit layers 122a through 122d and the first through fourth unit is layers 123a through 123d may be formed by printing. The first unit layers 122a and 123a may be 1-degree printed layers, the second unit layers 122b and 123b may be 2-degree printed layers, the third unit layers 122c and 123c may be 3-degree printed layers, and the fourth unit layers 122d and 123d may be 4-degree printed layers. More vivid colors can be obtained by printing the same colors multiple times. In the exemplary embodiment of FIG. 8, the first through fourth unit layers 122a through 122d and the first through fourth unit layers 123a through 123d may all appear black, thereby achieving a vivid black color, and this means that the light absorption efficiency of the first and second light-absorbing layers 122 and 123 can be further improved. The first through fourth unit layers 122a through 122d and the first through fourth unit layers 123a through 123d may also be formed by a method other than printing.

In the exemplary embodiment of FIG. 8, the first and second light-absorbing layers 122 and 123 both include four unit layers, but the present disclosure is not limited thereto. That is, the first and second light-absorbing layers 122 and 123 may include two, three, or five or more unit layers. Also, the number of unit layers of the first light-absorbing layer 122 may differ from the number of unit layers of the second light-absorbing layer 123. Since the OD of the cover panel portion 102 is generally proportional to the sum of the thicknesses of the unit layers of the first light-absorbing layer 122 and the thicknesses of the unit layers of the second light-absorbing layer 123, the first and second light-absorbing layers 122 and 123 may be formed by stacking various numbers of unit layers in accordance with a desired OD.

Figure 9:
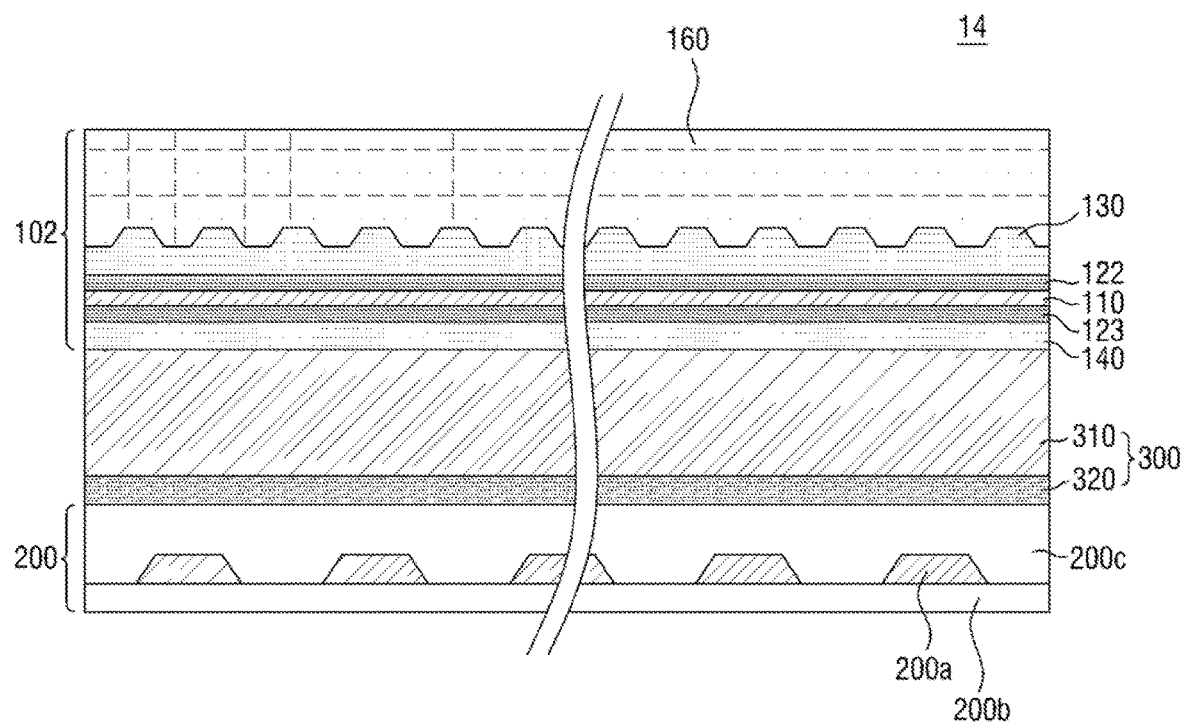
FIGS. 9 and 10 are cross-sectional views of panel bottom sheets according to other exemplary embodiments of the present disclosure.
Figure 10:
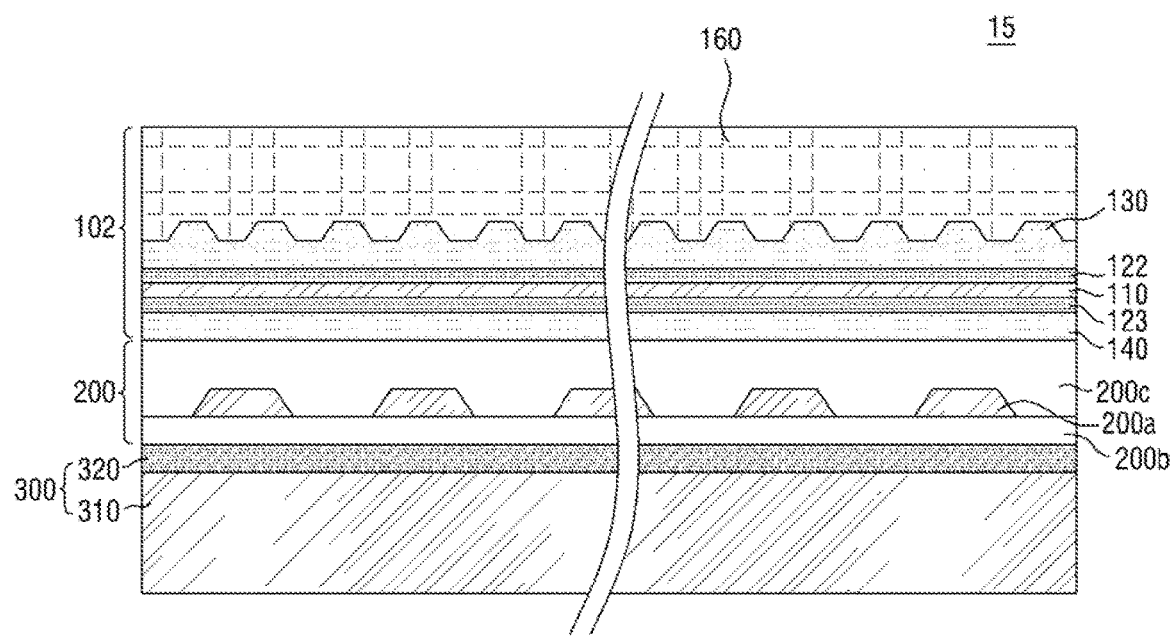

FIGS. 9 and 10 are cross-sectional views of panel bottom sheets according to other exemplary embodiments of the present disclosure. Referring to FIGS. 9 and 10, panel bottom sheets 14 and 15 differ from the panel bottom sheet 12 according to the exemplary embodiment of FIG. 7 in that they further include a buffer portion 300. The buffer portion 300 may include a buffer member 310 and a second interlayer bonding layer 320.

The buffer member 310 absorbs an external shock and thus prevents the display device 70 from being damaged. The buffer member 310 may be formed as a single film or a stack of a plurality of films. The buffer member 310 may be formed of a material with elasticity such as, for example, a polyurethane (PU) or PE resin. The buffer member 310 may be a cushion layer.

The second interlayer bonding layer 320 bonds the buffer member 310 to another member and may be formed of one of the aforementioned examples of the material of the top bonding layer 130 of the panel bottom sheet 11 according to the exemplary embodiment of FIG. 4. In the exemplary embodiments of FIGS. 9 and 10, the second interlayer bonding layer 320 may be included in the buffer portion 300. Alternatively, the second interlayer bonding layer 320 may be included in another member or may be provided as a separate member.

In one exemplary embodiment, the buffer member 310 may be disposed between a cover panel portion 102 and a wiring pattern portion 200, as illustrated in FIG. 9. In this example, the second interlayer bonding layer 320 is disposed on the bottom surface of the buffer member 310 and is bonded to the wiring pattern portion 200. The top surface of the buffer member 310 is bonded to a first interlayer bonding layer 140.

In another exemplary embodiment, the buffer member 310 may be disposed below the wiring pattern portion 200, as illustrated in FIG. 10. In this example, the second interlayer bonding layer 320 is disposed on the top surface of the buffer member 310 and is bonded to the wiring pattern portion 200.

Figure 11:
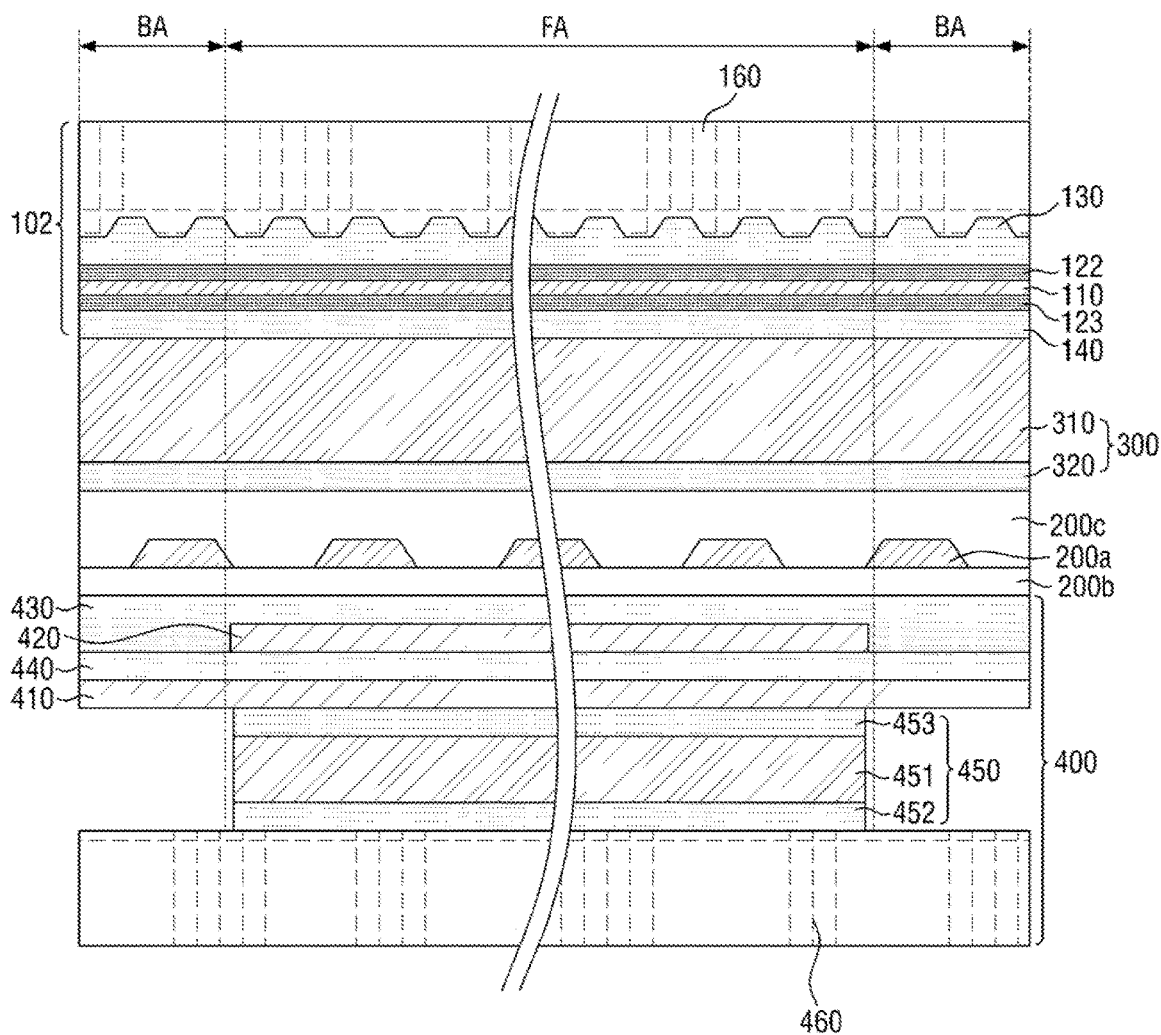
FIG. 11 is a cross-sectional view of a panel bottom sheet according to another exemplary embodiment of the present disclosure.

FIG. 11 is a cross-sectional view of a panel bottom sheet according to another exemplary embodiment of the present disclosure. Referring to FIG. 11, a panel bottom sheet 16 differs from the panel bottom sheet 14 according to the exemplary embodiment of FIG. 9 in that it further includes a heat dissipation portion 400.

Specifically, the heat dissipation portion 400 may be disposed below a wiring pattern portion 200. The heat dissipation portion 400 may include at least one heat dissipation layer. FIG. 11 illustrates an example in which the heat dissipation portion 400 includes two heat dissipation layers, i.e., first and second beat dissipation layers 410 and 420.

The first and second heat dissipation layers 410 and 420 may be formed of the same material or may be formed of materials having different heat dissipation characteristics. The first heat dissipation layer 410 may include, for example, a metal film such as a Cu or Ag film. The second heat dissipation layer 420 may include, for example, graphite or carbon nanotubes (CNTs).

The second heat dissipation layer 420 may be disposed above the first heat dissipation layer 410. The first and second heat dissipation layers 410 and 420 may be disposed to overlap with each other. The second heat dissipation layer 420 may be smaller in size than the first heat dissipation layer 410, and the sides of the second heat dissipation layer 420 may be positioned more inwardly than the sides of the first heat dissipation layer 410. For example, in response to the panel bottom sheet 16 being bonded to a bent display panel 20, the first heat dissipation layer 410 may be disposed in both a flat area FA and bending areas BA. On the other hand, the second heat dissipation layer 420 may be disposed in the flat area FA, but not in the bending areas BA. This type of arrangement may be employed in a case where the second heat dissipation layer 420 is formed of a material with relatively poor bending characteristics such as, for example, graphite, or is too thick to be properly bent.

The second heat dissipation layer 420 is covered by a third interlayer bonding layer 430, and the third interlayer bonding layer 430 is bonded to the wiring pattern portion 200, which is disposed above the third interlayer bonding layer 430. A fourth interlayer bonding layer 440 may be interposed between the second heat dissipation layer 420 and the first heat dissipation layer 410 and may bond the second heat dissipation layer 420 and the first heat dissipation layer 410 together. The second heat dissipation layer 420 may expose edge portions of the fourth interlayer bonding layer 440, and the top surfaces of the edge portions of the fourth interlayer bonding layer 440 may be placed in direct contact with, and bonded to, the third interlayer bonding layer 430, which is disposed above the fourth interlayer bonding layer 440.

The heat dissipation portion 400 may further include a bottom bonding member 450 and a second release film 460. The bottom bonding member 450 may be disposed on the bottom surface of the first heat dissipation layer 410 and bonds the panel bottom sheet 16 to a bracket 60, which may be disposed below the panel bottom sheet 16, as illustrated in FIG. 3.

In one exemplary embodiment, the bottom bonding member 450 may be provided as a double-sided tape. The double-sided tape includes a tape base 451, a first bonding layer 452 disposed on the bottom surface of the tape base 451, and a second bonding layer 453 disposed on the top surface of the tape base 451. The tape base 451 may be formed of PET, PI, PC, PE, PP, PSF, PMMA, TAC, or a COP. The first and second bonding layers 452 and 453 may be formed of one of the aforementioned examples of the material of the top bonding layer 130 of the panel bottom sheet 11 according to the exemplary embodiment of FIG. 4. Alternatively, the bottom bonding member 450 may include a single bonding layer or a plurality of bonding layers without having the tape base 451.

The second release film 460 is disposed on the bottom surface of the bottom bonding member 450 and protects the bottom surface of the bottom bonding member 450. The second release film 460 may be substantially the same as the first release film 130. FIG. 11 illustrates an example in which the second release film 460 has no embossed shape on the top surface thereof, but alternatively, the second release film 460, like the first release film 131 having an embossed shape on the bottom surface thereof, may have an embossed shape on the top surface thereof.

The bottom bonding member 450, like the second heat dissipation layer 420, may be disposed in the flat area FA, but not in the bending areas BA. The sides of the bottom bonding member 450 may be aligned with, or positioned more inwardly than, the sides of the second heat dissipation layer 420. A waterproof tape (not illustrated) may be attached to part of the bottom surface of the first heat dissipation layer 410 exposed by the bottom bonding member 450 and may be bonded to the bracket 60.

In the exemplary embodiment of FIG. 11, the bottom bonding member 450 is included in the heat dissipation portion 400, but may be provided as a separate member. Alternatively, the bottom bonding member 450 may be provided at lowermost portions of panel bottom sheets having various stack structures to bond the panel bottom sheets to the bracket 60. For example, the bottom bonding member 450 may be disposed below the wiring pattern portion of the panel bottom sheet 12 according to the exemplary embodiment of FIG. 7.

A digitizer, which is used as the wiring pattern portion 200 of each of the panel bottom sheets 11 through 16 according to the exemplary embodiments of FIGS. 4 and 7 through 11, will hereinafter be described.

Figure 12:
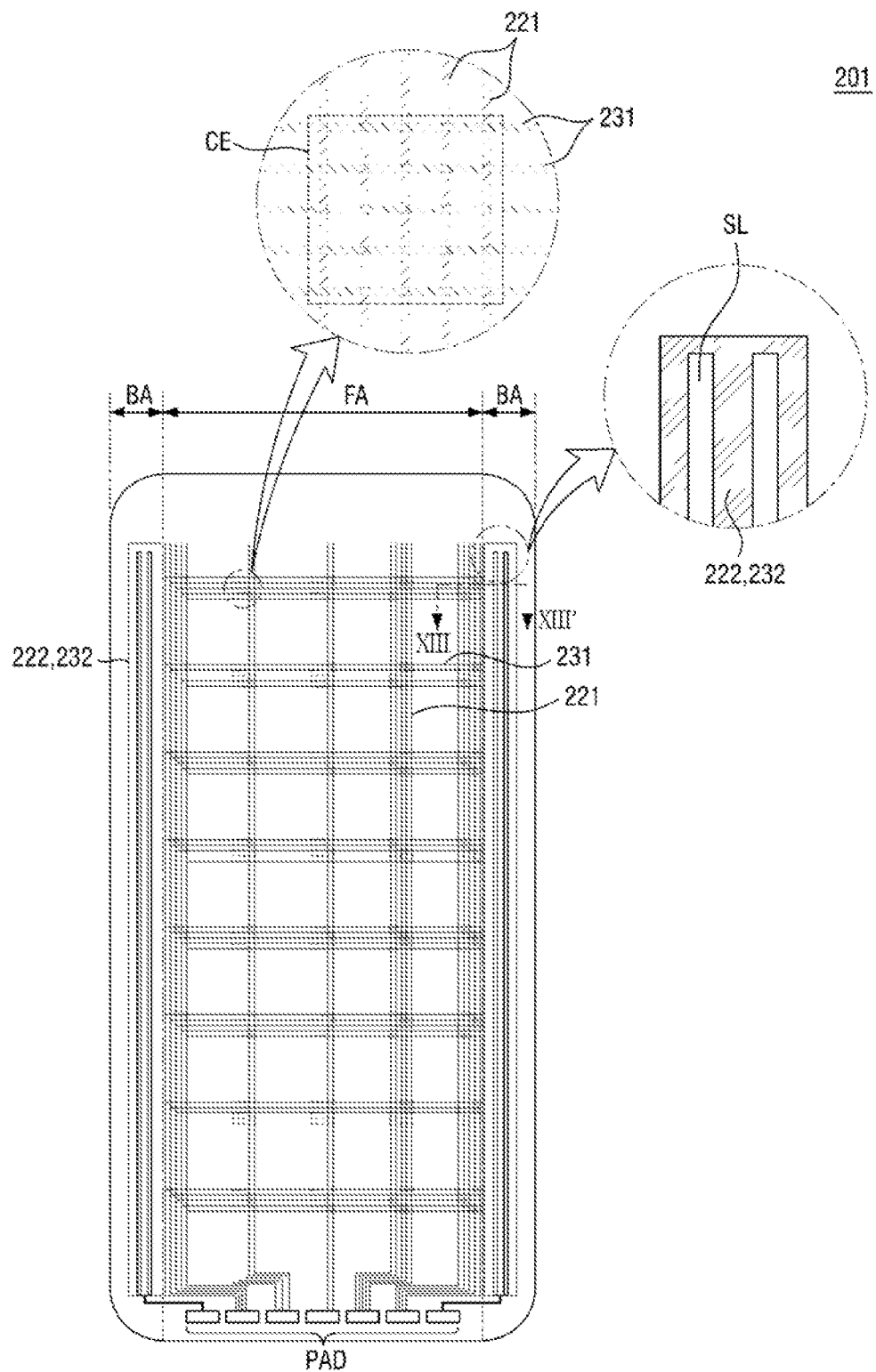
FIG. 12 is a layout view of a digitizer according to an exemplary embodiment of the present disclosure.
Figure 13:
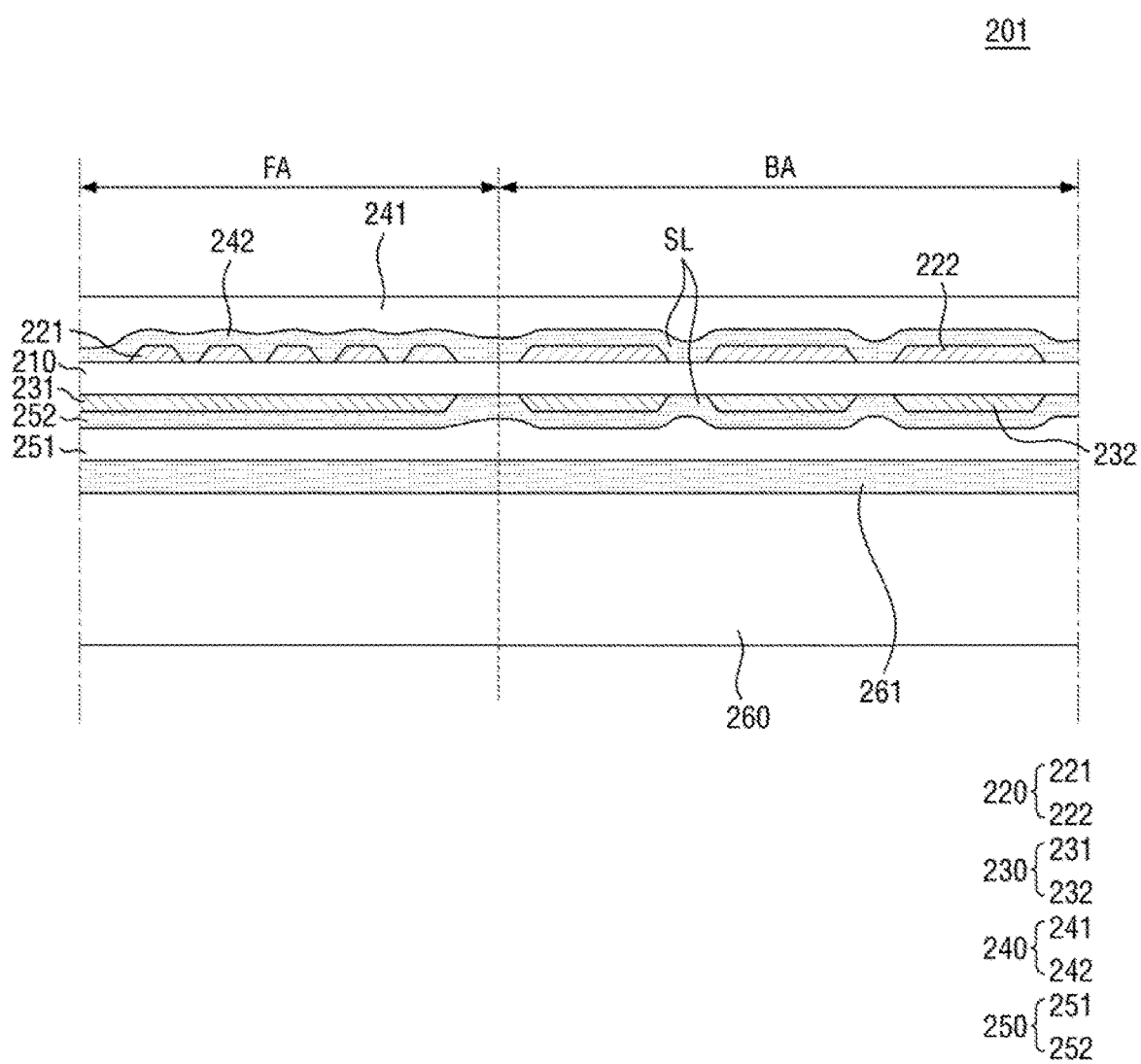
FIG. 13 is a cross-sectional view taken along line XIII-XIII' of FIG. 12.
Figure 14:
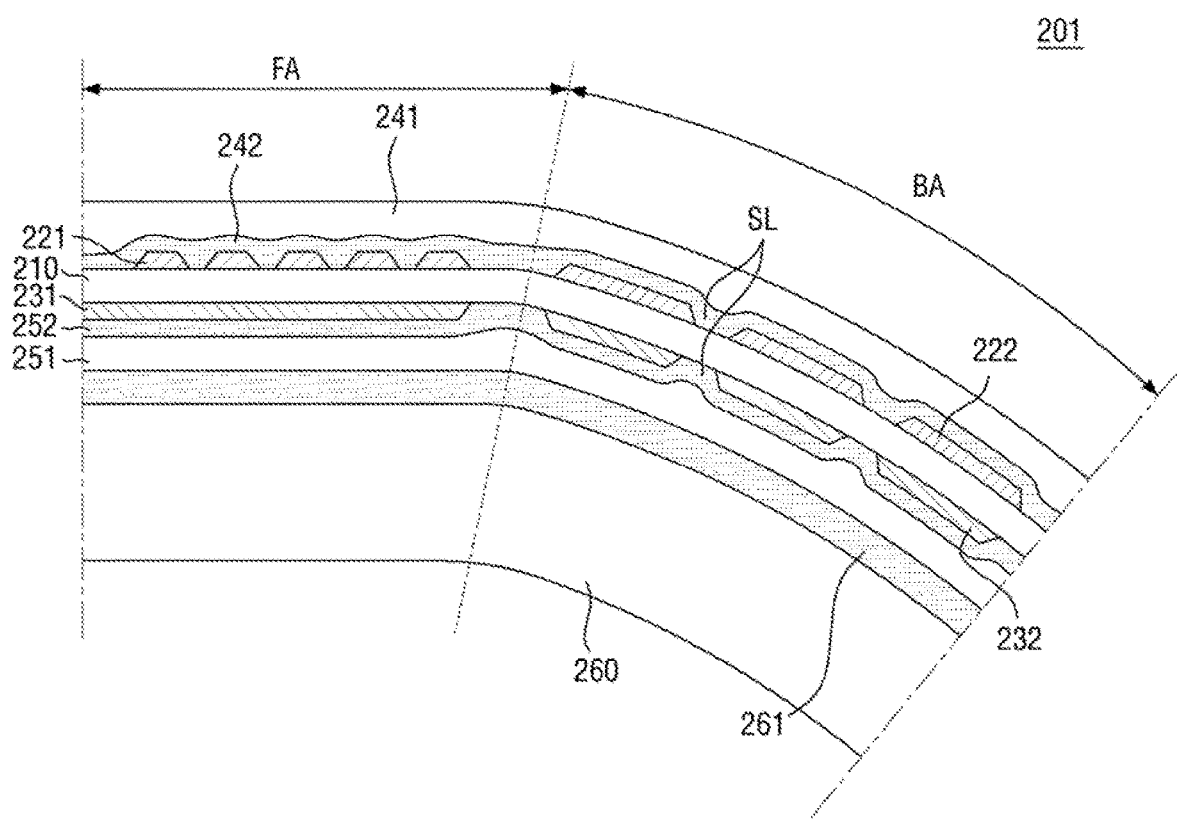
FIG. 14 is a cross-sectional view showing the digitizer according to the exemplary embodiment of FIG. 12 in a bent state.

FIG. 12 is a layout view of a digitizer according to an exemplary embodiment of the present disclosure. FIG. 13 is a cross-sectional view taken along line XIII-XIII' of FIG. 12. FIG. 14 is a cross-sectional view showing the digitizer according to the exemplary embodiment of FIG. 12 in a bent state.

Referring to FIGS. 12 through 14, a digitizer 201 includes a base layer 210, a first wiring layer 220 disposed on the top surface of the base layer 210, and a second wiring layer 230 disposed on the bottom surface of the base layer 210. The digitizer 201 may further include a first coverlay 240 covering the first wiring layer 220 from above, a second coverlay 250 covering the second wiring layer 230 from below, a signal shielding sheet 260 disposed below the second coverlay 250, and a fifth interlayer bonding layer 261 interposed between the signal shielding sheet 260 and the second coverlay 250. The top surface of the first coverlay 240 may be bonded to the bottom surface of the second interlayer bonding layer 320 of FIG. 11, and the bottom surface of the signal shielding sheet 260 may be bonded to the third interlayer bonding layer 430 of FIG. 1.

The base layer 210 provides space in which to form the first and second wiring layers 220 and 230. The base layer 210 may be formed of an insulating material. The base layer 210 may comprise an inorganic material such as glass, or may comprise an organic material in order to realize flexibleness. For example, the base layer 210 may comprise at least one of PI, PET, PC, PE, PP, PSF, PMMA, TAC, and a COP. For example, the base layer 210 may comprise PI.

The first and second wiring layers 220 and 230 are disposed on the top surface and the bottom surface, respectively, of the base layer 210. The first and second wiring layers 220 and 230 may be formed directly on the base layer 210. The first and second wiring layers 220 and 230 may comprise a metal material such as Cu, Ag, Ni, or W. FIGS. 12 through 14 illustrate an example in which the first and second wiring layers 220 and 230 are single films, but alternatively, each of the first and second wiring layers 220 and 230 may be formed as a stack of a plurality of films. For example, each of the first and second wiring layers 220 and 230 may include a stack of first and second Cu films.

The first wiring layer 220 includes a plurality of first wiring patterns 221 and first ground wirings 222. The second wiring layer 230 includes a plurality of second wiring patterns 231 and second ground wirings 232.

The first wiring patterns 221 may extend in a first direction, for example, a long-side direction. The second wiring patterns 231 may extend in a second direction, which intersects the first direction, for example, a short-side direction. The first wiring patterns 221 and the second wiring patterns 231 may be disposed mostly in a flat area FA, but not in bending areas BA. Alternatively, some of the first wiring patterns 221 and some of the second wiring patterns 231 may be disposed in the bending areas BA.

A number of first wiring patterns 221 may form a wiring pattern group, and a number of second wiring patterns 231 may form a wiring pattern group. For example, as illustrated in FIG. 12, five first or second wiring patterns 221 or 231 may form a single wiring pattern group, but the present disclosure is not limited thereto. That is, various numbers of first or second wiring patterns 221 or 231 form various numbers of wiring pattern groups.

The distance between wiring pattern groups formed by the first wiring patterns 221 or between wiring pattern groups formed by the second wiring patterns 231 may be greater than the distance between the first wiring patterns 221 or between the second wiring patterns 231. In a case where the distance between wiring patterns or wiring pattern groups is large in a particular region, height differences formed in the particular region may be reflected onto the top of the particular region, and as a result, the wiring patterns or the wiring pattern groups may become visible. However, as already mentioned above, since the first light-absorbing layer 122 and/or the second light-absorbing layer 123 of FIG. 11 may be disposed on the first wiring patterns 221 and the second wiring patterns 231, the first wiring patterns 221 and the second wiring patterns 231 can be prevented from becoming visible.

Areas where the wiring pattern groups formed by the first wiring patterns 221 and the wiring pattern groups formed by the second wiring patterns 231 intersect each other may become coordinate electrode portions CE, which are basic units for position recognition.

The first ground wirings 222 and the second grounding wirings 232 are disposed in the bending areas BA. The first ground wirings 222 and the second grounding wirings 232 may extend in the same direction as the first wiring patterns 221, i.e., in the long-side direction. The first ground wirings 222 and the second grounding wirings 232 may generally overlap with each other. FIGS. 12 through 14 illustrate an example in which the first ground wirings 222 and the second grounding wirings 232 completely overlap with each other in a plan view, but the present disclosure is not limited thereto.

Each of the first ground wirings 222 and the second grounding wirings 232 include slits SL. The slits SL may extend in the first direction. Each of the first ground wirings 222 and the second grounding wirings 232 may be divided into sub-wirings, which are separated from one another by the slits SL but are connected to one another at the end of the corresponding first or second ground wiring 222 or 232, but the present disclosure is not limited thereto. That is, the slits SL may be surrounded by each of the first ground wirings 222 and the second grounding wirings 232, but the present disclosure is not limited thereto. Alternatively, the slits SL may extend to the end of each of the first ground wirings 222 and the second grounding wirings 232 so that the sub-wirings of each of the first ground wirings 222 and the second grounding wirings 232 may be separated from one another, even at the end of the corresponding first or second ground wiring 222 or 232. FIGS. 12 through 14 illustrate an example in which two slits SL are provided in each of the first ground wirings 222 and the second ground wirings 232 to divide the corresponding first or second ground wirings 222 or 232 into three sub-wirings, but alternatively, only one slit SL or three or more slits SL may be provided in each of the first ground wirings 222 and the second ground wirings 232. The slits SL reduce bending stress.

Specifically, the first ground wirings 222 and the second ground wirings 232 have a relatively wide width. For example, the width of the first ground wirings 222 and the second ground wirings 232 may be greater than the width of the first wiring patterns 221 and the second wiring patterns 231. If the first ground wirings 222 and the second ground wirings 232, which are both disposed in the bending areas BA, have too large width, a considerable amount of stress may be applied to the bending areas BA during the attachment of a panel bottom sheet including the digitizer 201 to a display panel 20. For example, in a case where the first ground wirings 222 and the second ground wirings 232 are formed of Cu, the bending resistance of the first ground wirings 222 and the second ground wirings 232 is relatively strong so that the panel bottom sheet including the digitizer 201 may not be able to be properly attached to the display panel 20 or that the bonding force between the panel bottom sheet including the digitizer 201 and the display panel 20 may weaken later.

In the exemplary embodiment of FIGS. 12 through 14, the slits SL are formed in each of the first ground wirings 222 and the second ground wirings 232, thereby offering the same effect of reducing the width of the first ground wirings 222 and the second ground wirings 232. That is, as illustrated in FIG. 14, flexibility can be secured in the slits SL where no wiring material is provided, and as a result, the first ground wirings 222 and the second ground wirings 232 can be properly bent.

The slits SL may also help prevent each of the first ground wirings 222 and the second ground wirings 232 from becoming visible. Specifically, in a case where the first ground wirings 222 and the second ground wirings 232 are formed to have no slits SL, the first ground wirings 222 and the second ground wirings 232 are highly likely to be visible from the outside because of strong reflections that may occur over their relatively large areas. On the other hand, in the exemplary embodiment of FIGS. 12 through 14, each of the first ground wirings 222 and the second ground wirings 232 is divided into sub-wirings by the slits SL. As a result, the reflectivity of the first ground wirings 222 and the second ground wirings 232 may be reduced, and as a result, the visibility of the first ground wirings 222 and the second ground wirings 232 may also be reduced.

A pad portion PAD is provided at one side of the base layer 210. An external device such as a PCB or a FPCB is connected to the pad portion PAD. The first wiring patterns 221 and the second wiring patterns 231 are connected to the pad portion PAD so that the digitizer 201 can be communicated with the external device.

The pad portion PAD may comprise the material of the first wiring layer 220 and/or the material of the second wiring layer 230. In a case where the pad portion PAD comprises both the materials of the first wiring layer 220 and the second wiring layer 230, a PCB or FPC may be connected to the pad portion PAD, the first wiring patterns 221 and the first ground wirings 222 may be connected to part of the pad portion PAD corresponding to the first wiring layer 220, and the second wiring patterns 231 and the second ground wirings 232 may be connected to part of the pad portion PAD corresponding to the second wiring layer 230.

In one exemplary embodiment, the first and second wiring layers 220 and 230 may be electrically connected through via holes, and this will hereinafter be described with reference to FIG. 15.

Figure 15:
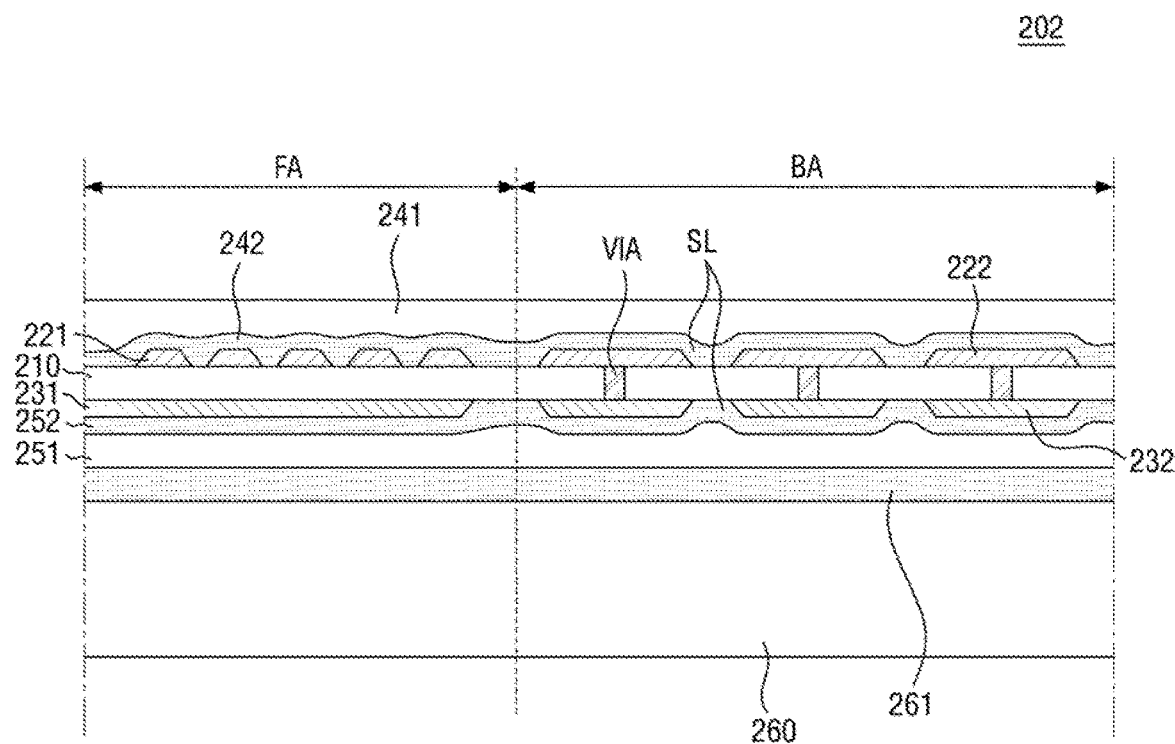
FIG. 15 is a cross-sectional view of a digitizer according to another exemplary embodiment of the present disclosure.

FIG. 15 is a cross-sectional view of a digitizer according to another exemplary embodiment of the present disclosure. Referring to FIG. 15, a digitizer 202 may further include via holes VIA formed through a base layer 210 and connecting first and second wiring layers 220 and 230.

For example, a first ground wiring 222 of the first wiring layer 220 and a second ground wiring 232 of the second wiring layer 230 are all wirings for grounding and may be short-circuited. The via holes VIA electrically connect the first and second ground wirings 222 and 232 to short-circuit the first and second ground wirings 222 and 232. The via holes VIA may be formed in sub-wirings, respectively, of each of the first and second ground wirings 222 and 232, divided by slits SL, as illustrated in FIG. 15. Alternatively, the via holes VIA may be formed only in part of each of the first and second ground wirings 222 and 232.

The via holes VIA may be filled with the material of the first wiring layer 220. In this case, the material of the first wiring layer 220 and the material filling the via holes VIA may not have any physical boundary therebetween. Alternatively, the via holes VIA may be filled with the material of the second wiring layer 230. Still alternatively, the via holes VIA may be filled with a material other than the materials of the first and second wiring layers 220 and 230. In this example, the boundaries between the material filling the via holes VIA and the first and second ground wirings 222 and 232 may be observed.

Although not specifically illustrated, the via holes VIA may also be formed through the base layer 210 through which the pad portions PAD which is formed of the material of the first wiring layer 220 and the second wiring patterns 230 are connected. For example, in a case where a pad portion PAD comprises only the material of the first wiring layer 220, the pad portion PAD through which a control signal or an output signal of the second wiring patterns 230 is transmitted is connected to the second wiring patterns 230 through the via holes VIA. The first wiring layer 220 connected to the second wiring pattern 231 via the via holes VIA may be disposed on the outer side of the first wiring pattern 221, which forms a coordinate electrode portion CE, for example, in or around a bent portion BA.

First and second coverlays 240 and 250, which protect the first and second wiring layers 220 and 230, respectively, may be formed of an insulating material. The first and second coverlays 240 and 250 may be formed as single films or stacks of a plurality of films.

For example, the first coverlay 240 may include a first coverlay bonding layer 242 and a first coverlay insulating layer 241 sequentially stacked in an upward direction, and the second coverlay 250 may include a second coverlay bonding layer 252 and a second coverlay insulating layer 251 sequentially stacked in a downward direction.

The first and second coverlay insulating layers 241 and 251 may be formed of at least one of PI, PET, PC, PE, PP, PSF, PMMA, TAC, and a COP. In one exemplary embodiment, the first and second coverlay insulating layers 241 and 251 may comprise PI. The first and second coverlay bonding layers 242 and 252 may be formed of one of the aforementioned examples of the material of the top bonding layer 130 of the panel bottom sheet 11 according to the exemplary embodiment of FIG. 4. The first and second coverlay bonding layers 242 and 252 may not be provided.

A signal shielding sheet 260 is disposed below the first and second wiring layers 220 and 230 and prevents signal interference. For example, in a case where an external device such as a PCB, FPCB, or a driving chip is disposed below a bracket 60, the external device may cause signal interference during the input of signals with a stylus pen, and the signal shielding sheet 260 prevents this type of signal interference. The signal shielding sheet 260 may be formed of a ferromagnetic material comprising iron oxide such as, for example, ferrite.

Figure 16:
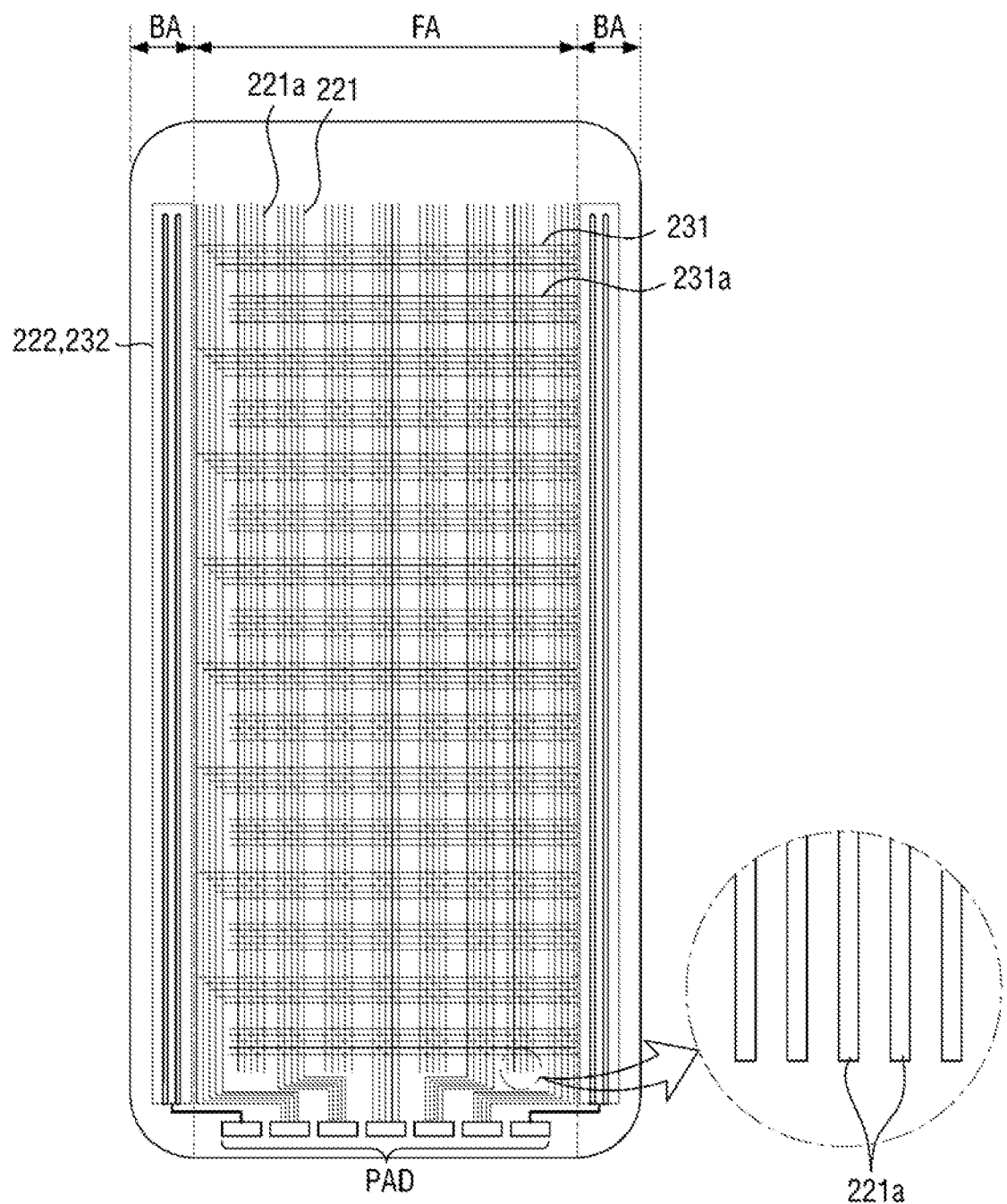
FIG. 16 is a layout view of a digitizer according to another exemplary embodiment of the present disclosure.

FIG. 16 is a layout view of a digitizer according to another exemplary embodiment of the present disclosure.

Referring to FIG. 16, a digitizer 203 differs from the digitizer 201 according to the exemplary embodiment of FIG. 12 in that it further includes a plurality of first floating wiring patterns 221a and a plurality of second floating wiring patterns 231a.

The first floating wiring patterns 221a are disposed among wiring pattern groups formed by first wiring patterns 221, and the second floating wiring patterns 231a are disposed among wiring pattern groups formed by second wiring patterns 231. Since the first or second floating wiring patterns 221a or 231a are disposed among the wiring pattern groups formed by the first or second wiring patterns 221 or 231, the gaps among the wiring pattern groups formed by the first or second wiring patterns 221 or 231 are filled. Accordingly, the same effect of reducing the distance between the wiring pattern groups formed by the first or second wiring patterns 221 or 231 can be offered, and as a result, the visibility of the first wiring patterns 221 and the second wiring patterns 231 can be reduced.

Examples 1 through 5 and Experimental Examples 1 and 2 in accordance with the present disclosure will hereinafter be described.

Example 1

The bottom surface of a PET base was coated with black ink to a thickness of 1 μm twice to form a black ink layer having a thickness of 2 μm. Thereafter, an adhesive was respectively applied to the top surface of the black ink layer to a thickness of 28 μm and to the bottom surface of the PET base to a thickness of 15 μm, thereby obtaining a cover panel film.

Example 2

A cover panel film was fabricated using the same method used to obtain the cover panel film according to Example 1 except for coating the bottom surface of a PET base with black ink to a thickness of 1 μm three times to form a black ink layer having a thickness of 3 μm.

Example 3

The top surface and the bottom surface of a PET base were both coated with black ink to a thickness of 1 μm twice to form a black ink layer having a thickness of 2 μm on each of the top and bottom surfaces of the PET base. Thereafter, an adhesive was respectively applied to the top surface of the black ink layer on the top surface of the PET base to a thickness of 28 μm and to the bottom surface of the black ink layer on the bottom surface of the PET base to a thickness of 15 μm, thereby obtaining a cover panel film.

Example 4

A cover panel film was fabricated using the same method used to obtain the cover panel film according to Example 3 except for coating both the top surface and the bottom surface of a PET base with black ink to a thickness of 1 μm three times to form a black ink layer having a thickness of 3 μm on each of the top and bottom surfaces of the PET base.

Example 5

A cover panel film was fabricated using the same method used to obtain the cover panel film according to Example 3 except for coating both the top surface and the bottom surface of a PET base with black ink to a thickness of 1 μm four times to form a black ink layer having a thickness of 4 μm on each of the top and bottom surfaces of the PET base.

Experimental Example 1: Measurement of OD

The ODs of the cover panel films according to Examples 1 through 5 were measured, and the results of the measurement are as shown in Table 1 below. OD is a logarithmic value of the ratio of an amount $I1$ of light transmitted through a particular medium to an amount $I0$ of light incident upon the particular medium, i.e., $I1/I0$. The higher the OD, the smaller the amount of light transmission, and the greater the amount of optical absorption.

TABLE 1

| Examples | Total Thickness of Black Ink Layer(s) (μm) | OD |
|---|---|---|
| Example 1 | 2 | 3.4 |
| Example 2 | 3 | 4.4 |
| Example 3 | 4 | 5.0 |
| Example 4 | 6 | 6.2 |
| Example 5 | 8 | 6.5 |

Experimental Example 2: Measurement of Reflectance

Reflectance measurement was conducted by placing a digitizer below each of the cover panel films according to Examples 2 and 5. Referring to Table 2 below, "Top" denotes a location near one short side of each of the cover panel films according to Examples 2 and 5, which are rectangular in shape, "Middle" denotes a location in the middle of each of the cover panel films according to Examples 2 and 5, and "Bottom" denotes a location near the other short side of each of the cover panel films according to Examples 2 and 5. Reflectance measurements obtained from the cover panel films according to Examples 2 and 5 are as shown in Table 2 below.

TABLE 2

| | Measurement Location | Reflectance |
|---|---|---|
| Example 2 | Top | 4.931 |
| | Middle | 4.950 |
| | Bottom | 4.874 |
| | Average | 4.918 |
| Example 5 | Top | 4.849 |
| | Middle | 4.864 |
| | Bottom | 4.832 |
| | Average | 4.848 |

While exemplary embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further exemplary embodiments of the present disclosure.

What is claimed is:

1. A panel bottom sheet, comprising:
   a first base;
   a first light-absorbing layer disposed on a top surface or a bottom surface of the first base, the first light-absorbing layer blocking transmission of light through the first light-absorbing layer;
   a top bonding layer disposed above the first base and the first light-absorbing layer;
   an interlayer bonding layer disposed below the first base and the first light-absorbing layer; and
   a wiring pattern portion disposed below the interlayer bonding layer and including a plurality of wiring patterns,
   wherein the first light-absorbing layer is disposed to cover at least a geometric center of the first base, and
   wherein a portion of the first light-absorbing layer overlapping the geometric center of the first base includes a black ink.

2. The panel bottom sheet of claim 1, further comprising:
   a second light-absorbing layer,
   wherein
   the first light-absorbing layer is disposed on the top surface of the first base,
   the top bonding layer is disposed on a top surface of the first light-absorbing layer,
   the second light-absorbing layer is disposed on the bottom surface of the first base, and
   the interlayer bonding layer is disposed on a bottom surface of the second light-absorbing layer.

3. The panel bottom sheet of claim 2, wherein a sum of thicknesses of the first and second light-absorbing layers is from about 2 μm to about 10 μm.

4. The panel bottom sheet of claim 3, wherein each of the first light-absorbing layer and the second light-absorbing layer includes a stack of a plurality of unit layers.

5. The panel bottom sheet of claim 4, wherein
   each of the first light-absorbing layer and the second light-absorbing layer includes four unit layers, and
   a thickness of each of the unit layers is about 1 μm.

6. The panel bottom sheet of claim 5, wherein each of the unit layers include the black ink.

7. The panel bottom sheet of claim 1, wherein
   a thickness of the first light-absorbing layer is from about 2 μm to about 10 μm.

8. The panel bottom sheet of claim 1, wherein a top surface of the top bonding layer has an embossed shape.

9. The panel bottom sheet of claim 1, further comprising:
a buffer member disposed between the interlayer bonding layer and the wiring pattern portion; and
a heat dissipation member disposed on a bottom surface of the wiring pattern portion.

10. The panel bottom sheet of claim 1, wherein the wiring pattern portion includes a second base and a first wiring layer disposed on a top surface of the second base, and
the first wiring layer includes a plurality of first wiring patterns and first ground wirings.

11. The panel bottom sheet of claim 10, wherein the panel bottom sheet has a flat area and bending area disposed adjacent to the flat area,
the first wiring patterns are disposed in the flat area, and the first ground wirings are disposed in the bending area.

12. The panel bottom sheet of claim 11, wherein the first ground wirings include at least one slit extending in a first direction along which the first ground wirings extend and dividing a corresponding first ground wiring into sub-wirings.

13. The panel bottom sheet of claim 12, wherein
the wiring pattern portion further includes a second wiring layer disposed on a bottom surface of the second base,
the second wiring layer includes a plurality of second wiring patterns disposed in the flat area and second ground wirings disposed in the bending area, and
the second ground wirings include at least one slit extending in the first direction and dividing a corresponding second ground wiring into sub-wirings.

14. The panel bottom sheet of claim 13, wherein
the first wiring patterns extend in the first direction, and
the second wiring patterns extend in a second direction, which intersects the first direction.

15. A display device, comprising:
a display panel, the display panel including a light emitting surface through which an image is displayed and an opposing surface opposite to the light emitting surface;
a window disposed on the light emitting surface of the display panel; and
a panel bottom sheet disposed on the opposing surface of the display panel,
wherein the panel bottom sheet includes:
a first base,
a first light-absorbing layer disposed on a top surface or a bottom surface of the first base and covering at least a geometric center of the display panel,
a top bonding layer disposed above the first base and the first light-absorbing layer,
an interlayer bonding layer disposed below the first base and the first light-absorbing layer, and
a wiring pattern portion disposed below the interlayer bonding layer and including a plurality of wiring patterns, and wherein a portion of the first light-absorbing layer overlapping the geometric center of the display panel includes a black ink.

16. The display device of claim 15, wherein
the panel bottom sheet further includes a second light-absorbing layer,
the first light-absorbing layer is disposed on the top surface of the first base,
the top bonding layer is disposed on a top surface of the first light-absorbing layer,
the second light-absorbing layer is disposed on the bottom surface of the first base, and
the interlayer bonding layer is disposed on a bottom surface of the second light-absorbing layer.

17. The display device of claim 16, wherein a sum of thicknesses of the first and second light-absorbing layers is from about 2 μm to about 10 μm.

18. The display device of claim 17, wherein each of the first light-absorbing layer and the second light-absorbing layer includes a stack of a plurality of unit layers.

19. The display device of claim 18, wherein
each of the first light-absorbing layer and the second light-absorbing layer includes four unit layers, and
a thickness of each of the unit layers is about 1 μm.

20. The display device of claim 19, wherein each of the unit layers include the black ink.

21. The display device of claim 15, wherein
a thickness of the first light-absorbing layer is from about 2 μm to about 10 μm.

22. The display device of claim 15, further comprising:
a buffer member disposed between the interlayer bonding layer and the wiring pattern portion; and
a heat dissipation member disposed on a bottom surface of the wiring pattern portion.

23. The display device of claim 15, wherein
the display device has a flat area and bending area disposed adjacent to the flat area.

24. The display device of claim 23, wherein
the wiring pattern portion includes a second base, a first wiring layer disposed on a top surface of the second base, and a second wiring layer disposed on a bottom surface of the second base,
the first wiring layer includes a plurality of first wiring patterns extending in a first direction and disposed in the flat area and first ground wirings each having at least one slit dividing a corresponding first ground wiring into sub-wirings and extending in the first direction, and
the second wiring layer includes a plurality of second wiring patterns extending in a second direction, which intersects the first direction, and disposed in the flat area and second ground wirings each having at least one slit dividing a corresponding second ground wiring into sub-wirings and extending in the first direction.

* * * * *